(12) United States Patent
Dasgupta et al.

(10) Patent No.: US 11,670,709 B2
(45) Date of Patent: Jun. 6, 2023

(54) III-N TRANSISTORS WITH LOCAL STRESSORS FOR THRESHOLD VOLTAGE CONTROL

(71) Applicant: Intel Corporation, Santa Clara, CA (US)

(72) Inventors: Sansaptak Dasgupta, Hillsboro, OR (US); Marko Radosavljevic, Portland, OR (US); Han Wui Then, Portland, OR (US); Nidhi Nidhi, Hillsboro, OR (US); Rahul Ramaswamy, Portland, OR (US); Paul B. Fischer, Portland, OR (US); Walid M. Hafez, Portland, OR (US); Johann Christian Rode, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 879 days.

(21) Appl. No.: 16/297,837

(22) Filed: Mar. 11, 2019

(65) Prior Publication Data
US 2020/0295172 A1 Sep. 17, 2020

(51) Int. Cl.
| H01L 29/778 | (2006.01) |
| H01L 29/20 | (2006.01) |
| H01L 29/205 | (2006.01) |
| H01L 29/66 | (2006.01) |
| H01L 29/08 | (2006.01) |
| H01L 29/04 | (2006.01) |
| H01L 29/423 | (2006.01) |

(52) U.S. Cl.
CPC ........ *H01L 29/7787* (2013.01); *H01L 29/045* (2013.01); *H01L 29/0847* (2013.01); *H01L 29/2003* (2013.01); *H01L 29/205* (2013.01); *H01L 29/42356* (2013.01); *H01L 29/66462* (2013.01)

(58) Field of Classification Search
CPC .............. H01L 29/7787; H01L 29/045; H01L 29/0847; H01L 29/2003; H01L 29/205; H01L 29/42356; H01L 29/66462
See application file for complete search history.

(56) References Cited

U.S. PATENT DOCUMENTS

2012/0138944 A1* 6/2012 Kanamura .......... H01L 29/7787
257/E21.403
2021/0151594 A1* 5/2021 Wong .................. H01L 29/7786

* cited by examiner

*Primary Examiner* — Syed I Gheyas
(74) *Attorney, Agent, or Firm* — Akona IP

(57) ABSTRACT

Disclosed herein are IC structures, packages, and device assemblies with III-N transistors that include additional materials, referred to herein as "stressor materials," which may be selectively provided over portions of polarization materials to locally increase or decrease the strain in the polarization material. Providing a compressive stressor material may decrease the tensile stress imposed by the polarization material on the underlying portion of the III-N semiconductor material, thereby decreasing the two-dimensional electron gas (2DEG) and increasing a threshold voltage of a transistor. On the other hand, providing a tensile stressor material may increase the tensile stress imposed by the polarization material, thereby increasing the 2DEG and decreasing the threshold voltage. Providing suitable stressor materials enables easier and more accurate control of threshold voltage compared to only relying on polarization material recess.

20 Claims, 11 Drawing Sheets

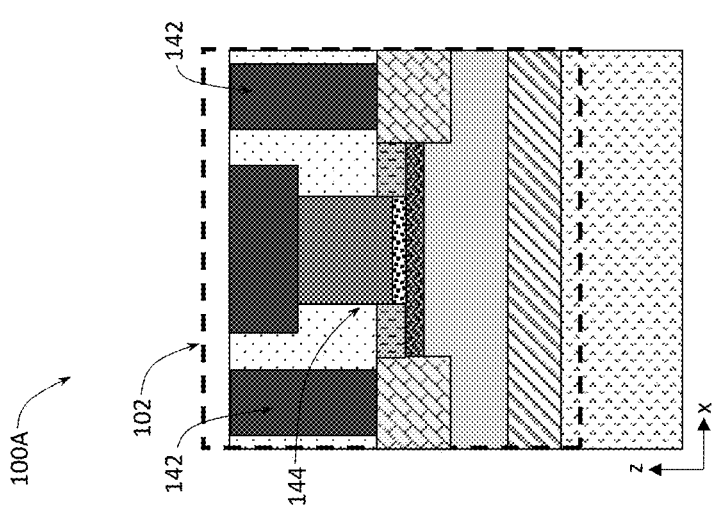
FIG. 1A
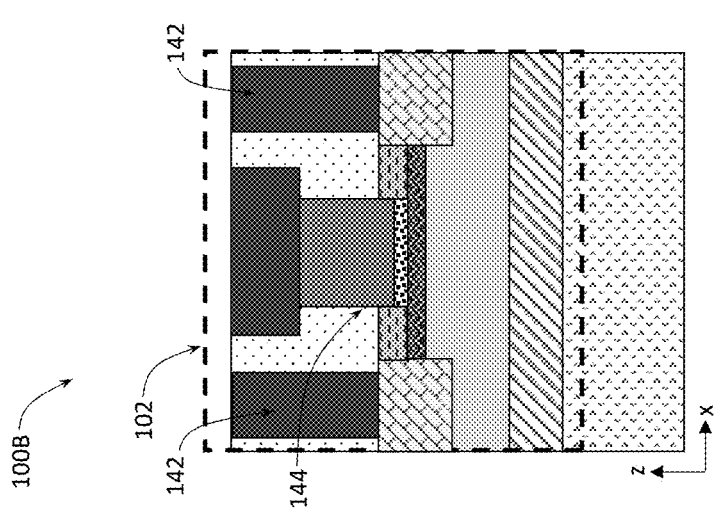
FIG. 1B
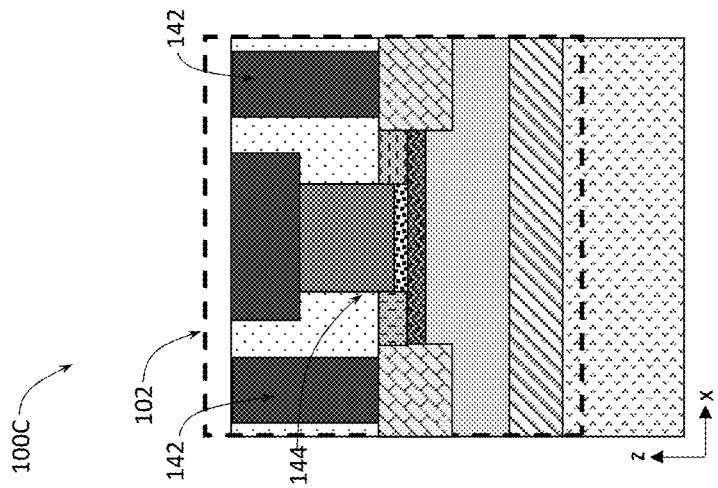
FIG. 1C
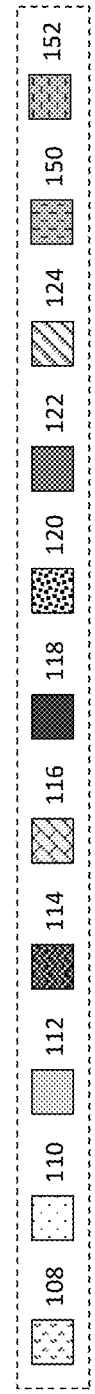

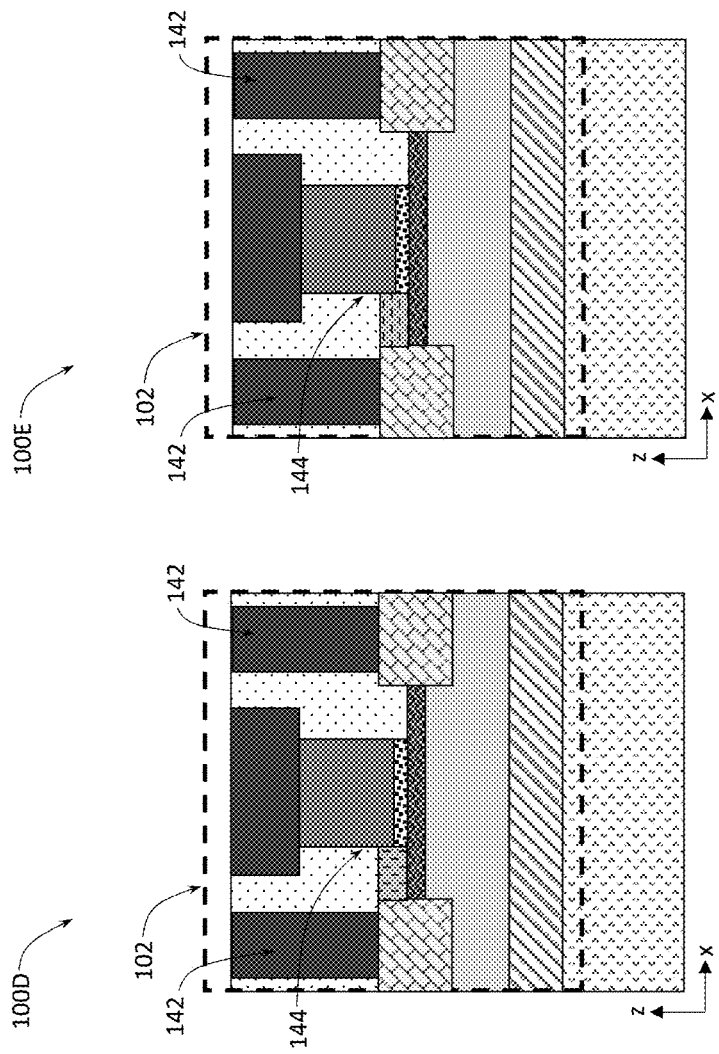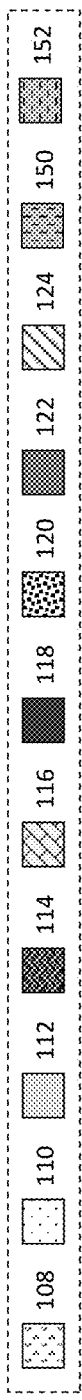

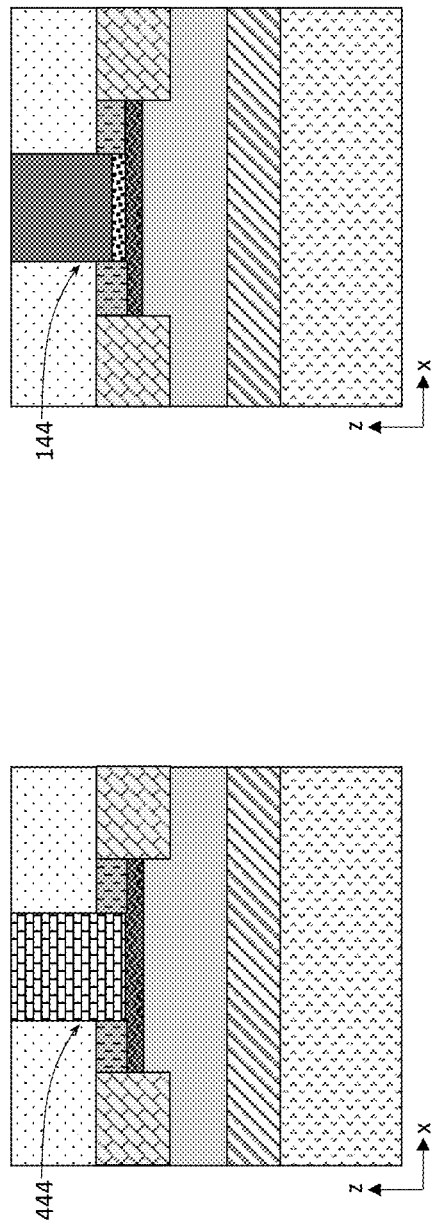

III-N TRANSISTORS WITH LOCAL STRESSORS FOR THRESHOLD VOLTAGE CONTROL

BACKGROUND

Solid-state devices that can be used in high-frequency and/or high voltage applications are of great importance in modern semiconductor technologies. For example, radio frequency (RF) integrated circuits (RFIC) and power management integrated circuits (PMIC) may be critical functional blocks in system on a chip (SoC) implementations. Such SoC implementations may be found in mobile computing platforms such as smartphones, tablets, laptops, netbooks, and the like. In such implementations, the RFIC and PMIC and RFIC are important factors for power efficiency and form factor, and can be equally or even more important than logic and memory circuits.

Due, in part, to their large band gap and high mobility, III-N material based transistors, such as gallium nitride (GaN) based transistors, may be particularly advantageous for high-frequency and high voltage applications.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1A provides a cross-sectional side view illustrating an integrated circuit (IC) structure that includes a III-N transistor with compressive stressors on both source and drain sides, according to some embodiments of the present disclosure.

FIG. 1B provides a cross-sectional side view illustrating an IC structure that includes a III-N transistor with tensile stressors on both source and drain sides, according to some embodiments of the present disclosure.

FIG. 1C provides a cross-sectional side view illustrating an IC structure that includes a III-N transistor with a compressive stressor on one and a tensile stressor on another one of source and drain sides, according to some embodiments of the present disclosure.

FIG. 1D provides a cross-sectional side view illustrating an IC structure that includes a III-N transistor with a compressive stressor on one and no stressor on another one of source and drain sides, according to some embodiments of the present disclosure.

FIG. 1E provides a cross-sectional side view illustrating an IC structure that includes a III-N transistor with a tensile stressor on one and no stressor on another one of source and drain sides, according to some embodiments of the present disclosure.

FIGS. 4A-4D are various views illustrating different example stages in the manufacture of the IC structure using the method of FIG. 3, according to some embodiments of the present disclosure.

DETAILED DESCRIPTION

Overview

Figure 2:
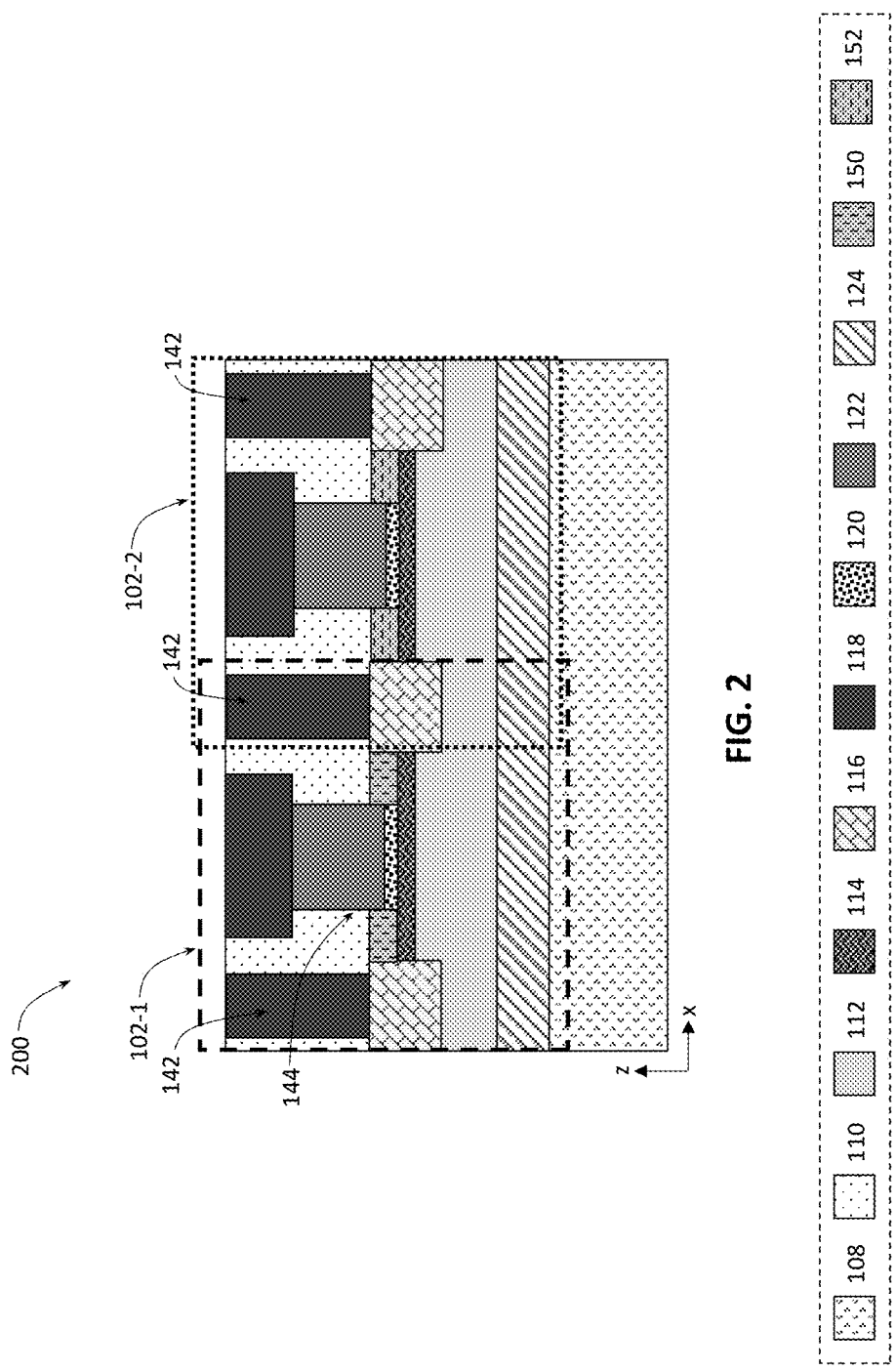
FIG. 2 provides a cross-sectional side view illustrating an IC structure that includes two coupled III-N transistors with local stressors, according to some embodiments of the present disclosure.

As mentioned above, transistors based on III-N semiconductor materials (i.e., III-N transistors) have properties that make them particularly advantageous for certain applications. For example, because GaN has a larger band gap (about 3.4 electronvolts (eV)) than silicon (Si; band gap of about 1.1 eV), a GaN transistor is expected to withstand a larger electric field (resulting, e.g., from applying a large voltage to the drain, Vdd) before suffering breakdown, compared to a Si transistor of similar dimensions.

Furthermore, III-N transistors may advantageously employ a 2D electron gas (2DEG) (i.e., a group of electrons, an electron gas, free to move in two dimensions but tightly confined in the third dimension, e.g., a 2D sheet charge) as its transport channel, enabling high mobilities without relying on using impurity dopants. For example, the 2DEG may be formed just below a heterojunction interface formed by deposition (e.g., epitaxial deposition), on a given III-N semiconductor material, of a charge-inducing film of a material having larger spontaneous and piezoelectric polarization, compared to the III-N semiconductor material. Such a film is generally referred to as a "polarization material" while the III-N semiconductor material may be referred to as a "III-N channel material" because this is where a conductive channel (2DEG) is formed during operation of the III-N transistor. Providing a polarization material such as AlGaN over a III-N channel material such as GaN induces tensile strain in the polarization material (due to the lattice mismatch between these two materials; namely, due to the lattice constant of AlGaN being smaller than that of GaN), which allows forming very high charge densities in the underlying III-N channel material without intentionally adding impurity dopants. As a result, high mobilities of charge carriers in the III-N channel material may, advantageously, be realized.

As used herein, the term "III-N semiconductor material" (or, simply, "III-N material" or "III-N channel material") refers to a compound semiconductor material with a first sub-lattice of at least one element from group III of the periodic table (e.g., Al, Ga, In) and a second sub-lattice of nitrogen (N). As used herein, the term "III-N transistor" refers to a field-effect transistor (FET) that includes a III-N material (which may include one or more different III-N materials, e.g., a plurality of different III-N materials stacked over one another) as an active material (i.e., the material in which a conducting channel of the transistor forms during operation, in which context the III-N material may be referred to as a "III-N channel material").

While discussions provided herein refer to the two-dimensional charge carrier layers as "2DEG" layers, embodiments described herein are also applicable to systems and material combinations in which 2D hole gas (2DHG) may be formed, instead of 2DEG. Thus, unless stated otherwise, explanations of embodiments referring to 2DEG may be applied to transistors implementing 2DHG instead, all of such embodiments being within the scope of the present disclosure.

Despite the advantages, there are some challenges associated with III-N transistors which hinder their large-scale implementation. One such challenge resides in controlling their threshold voltage (i.e., the minimum gate-to-source voltage, VGS, that is needed to create a conducting path between the source and drain terminals of a transistor). Conventional solutions include etching of a polarization layer to create a recess in which a gate stack for a III-N transistor is to be provided. However, such solutions do not always provide sufficient level of control of the resulting threshold voltage because nanometer-level control of the etching process is very difficult, especially when carried out on multiple transistors across a wafer. In addition, such solutions may not easily allow creation of both depletion mode transistors (i.e., transistors for which the threshold voltage is below 0 volts) and enhancement mode transistors (i.e., transistors for which the threshold voltage is above 0 volts) on a single wafer.

Disclosed herein are IC structures, packages, and device assemblies with III-N transistors that include additional materials, referred to herein as "stressor materials," which may be selectively provided over portions of a polarization material to locally increase or decrease the strain in the polarization material. Increasing or decreasing the strain in the polarization material affects the 2DEG formed in the underlying III-N channel material during operation of such transistors. Providing a compressive stressor material (i.e., a material that imposes compressive stress on the underlying portion of a polarization material) may decrease the tensile strain in the polarization material and, therefore, decrease the tensile stress imposed by that portion of the polarization material on the underlying portion of the III-N semiconductor material, thereby decreasing the 2DEG and increasing a threshold voltage of a transistor. On the other hand, providing a tensile stressor material (i.e., a material that imposes tensile stress on the underlying portion of a polarization material) may increase the tensile strain in the polarization material and, therefore, increase the tensile stress imposed by that portion of the polarization material on the underlying portion of the III-N semiconductor material, thereby increasing the 2DEG and decreasing a threshold voltage of a transistor. Providing suitable stressor materials enables easier and more accurate control of threshold voltage compared to that provided only by relying on polarization material recess. Moreover, depositing different stressor materials at different portions of the polarization material provides an easier manner for creating different types of III-N transistors on a single wafer.

In some embodiments, in order to impose sufficient stress on the underlying portion of a polarization material, a stressor material may be a material that can impose compressive stress or tensile stress having an absolute value equal to or greater than about 2 GigaPascal (GPa), e.g., equal to or greater than about 2.5 GPa, or equal to or greater than about 3 GPa. A positive stress value may be associated with a tensile stress, while a negative stress value may be associated with a compressive stress. The nature and the amount of stress induced may be detected and quantized using characterization techniques such as Raman spectroscopy, X-ray diffraction, or transmission electron microscopy (TEM).

Each of the structures, packages, methods, devices, and systems of the present disclosure may have several innovative aspects, no single one of which being solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc. Similarly, the terms naming various compounds refer to materials having any combination of the individual elements within a compound (e.g., "gallium nitride" or "GaN" refers to a material that includes gallium and nitrogen, "aluminum indium gallium nitride" or "AlInGaN" refers to a material that includes aluminum, indium, gallium and nitrogen, and so on). Further, the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20%, preferably within +/−10%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms such as "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 5A-5B, such a collection may be referred to herein without the letters, e.g., as "FIG. 5." In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated.

In the drawings, some schematic illustrations of example structures of various structures, devices, and assemblies described herein may be shown with precise right angles and straight lines, but it is to be understood that such schematic illustrations may not reflect real-life process limitations which may cause the features to not look so "ideal" when any of the structures described herein are examined using, e.g., TEM or scanning electron microscopy (SEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC structures that include at least one III-N transistor with one or more local stressors as described herein may be implemented in one or more components associated with an IC or/and between various such components. In various embodiments, components associated with an IC include, for example, transistors, diodes, power sources, resistors, capacitors, inductors, sensors, transceivers, transmitters, receivers, antennas, etc. Components associated with an IC may include those that are mounted on an IC, provided as an integral part of an IC, or those connected to an IC. The IC may be either analog or digital, or may include a combination of analog and digital circuitry, and may be used in a number of applications, such as microprocessors, optoelectronics, logic blocks, audio amplifiers, etc., depending on the components associated with the IC. In some embodiments, IC structures as described herein may be included in a RFIC, which may, e.g., be included in any component associated with an IC of an RF receiver, an RF transmitter, or an RF transceiver, or any other RF device, e.g., as used in telecommunications within base stations (BS) or user equipment (UE) devices. Such components may include, but are not limited to, power amplifiers (PA), RF switches (e.g., switches between different antenna elements of an RF antenna array), RF filters (including arrays of RF filters, or RF filter banks), or other portions of RF devices. In some embodiments, the IC structures as described herein may be employed as part of a chipset for executing one or more related functions in a computer.

Integrating One or More Local Stressors in a III-N Transistor

In III-N devices, piezoelectric polarization due to strained polarization films (e.g., AlGaN) on top of III-N channel materials (e.g., GaN) may be used to generate 2DEG channels. For example, tensile strain in a polarization material can lead to formation of 2DEG in the underlying III-N channel material. Embodiments of the present disclosure are based on recognition that application of tensile or compressive films on top of the polarization layer and near recessed regions (e.g., regions of the polarization material recessed for providing the gate stack) can locally enhance or degrade the strain in the polarization material and, hence, affect the 2DEG charge that forms in the channel during operation. For example, a polarization material of AlGaN provided on top of a III-N channel material of GaN may be in a tensile state, and if a compressively strained film is added on top of the polarization material, then the tensile strain in the polarization material can be reduced and, hence, the 2DEG charge in the channel can be reduced, leading to a higher threshold voltage. The opposite can happen if a tensile film is added on top of the polarization material; the tensile strain in the polarization material can be increased and, hence, the 2DEG charge in the channel can be increased, leading to a lower threshold voltage.

More generally, embodiments of the present disclosure are based on recognition that providing over a polarization material of a III-N transistor a stressor material that imposes a certain type of stress on the underlying polarization material allows changing the stress which, in turn, is imposed by the polarization material on the underlying III-N channel material. Such stressor materials may be referred to as "local stressors" because they may be deposited over the polarization material at certain locations of an IC structure (e.g., for different portions of a single III-N transistors, or for different III-N transistors of a single IC structure) to locally increase or decrease the stress imposed by the polarization material on the underlying III-N channel material. In various embodiments, a local stressor may be provided over a portion of a polarization material between a gate stack and one of source and drain (S/D) regions of a III-N transistor, or the same or different local stressors may be provided over each of the portions of the polarization material between the gate stack and each of the S/D regions. A stressor material provided between a gate stack and a source region of a transistor may be referred to as being "on the source side" of the transistor, while a stressor material provided between a gate stack and a drain region of a transistor may be referred to as being "on the drain side" of the transistor. Selectively depositing suitable stressor materials may be used to enable devices with different threshold voltages for a certain technology node, referred to as "dual threshold voltage devices" (e.g., depletion mode and enhancement mode devices), fabricated with substantially the same patterning the recess steps, and to enable fine tuning the threshold voltage for individual devices after the initial gate recess.

FIGS. 1A-1E provide cross-sectional side view illustrations of IC structures 100A-100E having various combinations of one or more local stressors which may be included in a III-N transistor 102 (an approximate boundary of which is illustrated in each of FIGS. 1A-1E with a thick dashed line) according to various embodiments of the present disclosure. Collectively, the IC structures 100A-100E, or any subset thereof, may be referred to as IC structures 100. The same reference numerals used in different ones of FIGS. 1A-1E refer to the same or analogous elements/materials, so that their descriptions are not repeated for each figure individually and, instead, the differences between these figures are described.

A legend provided within a dashed box at the bottom of each page showing any of FIGS. 1A-1E illustrates colors/patterns used to indicate some classes of materials of some of the elements shown in these figures, so that the figures are not cluttered by too many reference numerals. For example, FIGS. 1A-1E use different colors/patterns to identify a support structure 108, an insulator 110, a III-N channel material 112, a polarization material 114, S/D regions 116, an electrically conductive material 118 used to implement contacts to various transistor terminals, a gate dielectric material 120, a gate electrode material 122, a buffer material 124. In addition, FIGS. 1A-1E use different colors/patterns to identify a compressive stressor material 150 and a tensile stressor material 152.

For each of FIGS. 1A-1E, the support structure 108 may be any suitable structure, e.g., a substrate, a die, or a chip, on which III-N transistors as described herein may be implemented. In some embodiments, the support structure 108 may include a semiconductor, such as silicon. In other implementations, the support structure 108 may include/be alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N or group IV materials. In some embodiments, the support structure 108 may include a ceramic material, or any other non-semiconductor material. For example, in some embodiments, the support structure 108 may include glass, a combination of organic and inorganic materials, embedded portions having different materials, etc. Although a few examples of materials from which the support structure 108 may be formed are described here, any material that may serve as a foundation upon which at least one III-N transistor as described herein may be built falls within the spirit and scope of the present disclosure.

For each of FIGS. 1A-1E, in some embodiments, an insulator 110 may be provided in various portions of the IC structure 100, e.g., encompassing at least portions of the III-N transistor 102, as shown in FIGS. 1A-1E. Examples of the insulator 110 may include silicon oxide, silicon nitride, aluminum oxide, silicon oxynitride, or any other suitable interlayer dielectric (ILD) materials used in semiconductor manufacturing. Although not specifically shown in FIGS. 1A-1E, in some embodiments, an insulating layer, e.g., a layer of the insulator 110, may be provided between the support structure 108 and the buffer material 124 or, if the buffer material 124 is not present, the III-N channel material 112. Such an insulating layer may, e.g., include an oxide isolation layer, and may be used to electrically isolate the semiconductor material of the support structure 108 from other regions of or surrounding the III-N transistor 102 and/or from other regions of or surrounding other transistors (not specifically shown in FIGS. 1A-1E). Providing such an insulating layer over the support structure 108 and below the III-N transistor 102 may help mitigate the likelihood that undesirable conductive pathways will form through the support structure 108 (e.g., a conductive pathway between the S/D regions 116 of the III-N transistor 102).

In general, an insulating material such as the insulator 110 may be provided in various portions of the IC structure 100. In some embodiments, the insulator 110 may include a continuous insulator material encompassing at least portions of the III-N transistor 102. In various embodiments, an insulating material in the IC structure 100 may include different insulating materials in different portions of the IC structure 100, e.g., one type of the insulator 110 encompassing at least portions of the III-N transistor 102 and another type of the insulator 110 encompassing at least portions of other III-N transistors or other devices (not specifically shown in FIGS. 1A-1E).

For each of FIGS. 1A-1E, in some embodiments, the III-N channel material 112 may be formed of a compound semiconductor with a first sub-lattice of at least one element from group III of the periodic table (e.g., Al, Ga, In), and a second sub-lattice of nitrogen (N). In some embodiments, the III-N channel material 112 may be a binary, ternary, or quaternary III-N compound semiconductor that is an alloy of two, three, or even four elements from group III of the periodic table (e.g., boron, aluminum, indium, gallium) and nitrogen.

In general, the III-N channel material 112 may be composed of various III-N semiconductor material systems including, for example, N-type or P-type III-N materials systems, depending on whether the III-N transistor 102 is an N-type or a P-type transistor. For some N-type transistor embodiments, the III-N channel material 112 may advantageously be a III-N material having a high electron mobility, such as, but not limited to, GaN. In some embodiments, the III-N channel material 112 may be a ternary III-N alloy, such as InGaN, or a quaternary III-N alloy, such as AlInGaN, in any suitable stoichiometry.

In some embodiments, the III-N channel material 112 may be formed of a highly crystalline semiconductor, e.g., of substantially a monocrystalline semiconductor (possibly with some limited amount of defects, e.g., dislocations). The quality of the III-N channel material 112 (e.g., in terms of defects or crystallinity) may be higher than that of other III-N materials of, or near, the III-N transistor 102 since, during the operation of the III-N transistor 102, a transistor channel will form in the III-N channel material 112. A portion of the III-N channel material 112 where a transistor channel of the III-N transistor 102 forms during operation may be referred to as a "III-N channel material/region" of the III-N transistor 102.

In some embodiments, the III-N channel material 112 may be an intrinsic III-N semiconductor material or alloy, not intentionally doped with any electrically active impurity. In alternate embodiments, one or more a nominal impurity dopant level may be present within the III-N channel material 112, for example to set a threshold voltage Vt of the III-N transistor 102, or to provide halo pocket implants, etc. In such impurity-doped embodiments however, impurity dopant level within the III-N channel material 112 may be relatively low, for example below $10^{15}$ dopants per cubic centimeter ($cm^{-3}$), or below $10^{13}$ $cm^{-3}$.

In various embodiments, a thickness of the III-N channel material 112 may be between about 5 and 2000 nanometers, including all values and ranges therein, e.g., between about 50 and 1000 nanometers, or between about 10 and 50 nanometers. Unless specified otherwise, all thicknesses described herein refer to a dimension measured in a direction perpendicular to the support structure 108 (i.e., measured along the z-axis of the example coordinate system shown in FIGS. 1 and 2).

Turning now to the polarization material 114 of the III-N transistor 102, in general, the polarization material 114 may be a layer of a charge-inducing film of a material having larger spontaneous and/or piezoelectric polarization than that of the bulk of the III-N layer material immediately below it (e.g., the III-N channel material 112), creating a heterojunction (i.e., an interface that occurs between two layers or regions of semiconductors having unequal band gaps) with the III-N channel material 112, and leading to formation of 2DEG at or near (e.g., immediately below) that interface, during operation of the III-N transistor 102. As described above, a 2DEG layer may be formed during operation of a III-N transistor in a layer of a III-N channel material immediately below a suitable polarization layer. In various embodiments, the polarization material 114 may include materials such as AlN, InAlN, AlGaN, or $Al_xIn_yGa_{1-x-y}N$. In general, a crystalline material may serve as a polarization material for a given III-N channel material 112, if a lattice constant of the crystalline material is smaller than a lattice constant of the III-N channel material 112. For example, in some embodiments, the lattice constant of the polarization material 114 may be at least about 3% smaller, e.g., at least about 5% smaller, or between about 5 and 10% smaller than the lattice constant of the III-N channel material 112. The polarization material 114 having a lattice constant smaller than that of the III-N channel material 112 would result in a tensile stress imposed on the portion of the III-N channel material 112 that is adjacent (e.g., in contact with) such polarization material 114, which may then lead to formation of 2DEG in said portion of the III-N channel material 112. In various embodiments, the polarization material 114 may have a thickness between about 1 and 100 nanometers, including all values and ranges therein, e.g., between about 5 and 15 nanometers or between about 10 and 30 nanometers. In other embodiments, the polarization material 114 may have larger thicknesses in areas outside the gate stack of the III-N transistor 102.

As also shown in FIGS. 1A-1E, the III-N transistor 102 may include two S/D regions 116, where one of the S/D regions 116 is a source region and another one is a drain region, where the "source" and the "drain" designations may be interchangeable. As is well-known, in a transistor, S/D regions (also sometimes interchangeably referred to as "diffusion regions") are regions that can supply charge carriers for the transistor channel (e.g., the transistor channel region of the III-N channel material 112) of the transistor (e.g., the III-N transistor 102). In some embodiments, the S/D regions 116 may include highly doped semiconductor materials, such as highly doped InGaN. Often, the S/D regions may be highly doped, e.g., with dopant concentrations of at least above $1 \cdot 10^{20}$ $cm^{-3}$, in order to advantageously form Ohmic contacts with the respective S/D electrodes of the III-N transistor 102 (e.g., electrodes 142 shown in FIGS. 1A-1E, made of the electrically conductive material 118), although these regions may also have lower dopant concentrations in some implementations. Regardless of the exact doping levels, the S/D regions 116 may be the regions having dopant concentration higher than in other regions between the source region (e.g., the S/D region 116 shown on the left side in FIGS. 1A-1E) and the drain region (e.g., the S/D region 116 shown on the right side in FIGS. 1A-1E) (e.g., higher than the III-N channel material 112). For that reason, sometimes the S/D regions are referred to as highly doped (HD) S/D regions. In further embodiments, one or more layers of metal and/or metal alloys may be used to form the S/D regions 116.

For each of FIGS. 1A-1E, the electrically conductive material 118 of the S/D electrodes 142 may include any suitable electrically conductive material, alloy, or a stack of multiple electrically conductive materials. In some embodiments, the electrically conductive material 118 may include one or more metals or metal alloys, with metals such as copper, ruthenium, palladium, platinum, cobalt, nickel, hafnium, zirconium, titanium, tantalum, and aluminum, tantalum nitride, titanium nitride, tungsten, doped silicon, doped germanium, or alloys and mixtures of these. In some embodiments, the electrically conductive material 118 may include one or more electrically conductive alloys, oxides, or carbides of one or more metals. In some embodiments, the electrically conductive material 118 may include a doped semiconductor, such as silicon or another semiconductor doped with an N-type dopant or a P-type dopant. Metals may provide higher conductivity, while doped semiconductors may be easier to pattern during fabrication. In some embodiments, the S/D electrodes 142 may have a thickness between about 2 nanometers and 1000 nanometers, preferably between about 2 nanometers and 100 nanometers. FIGS. 1A-1E further illustrate that the electrically conductive material 118 may also be used to form electrical contact to the gate electrode of the III-N transistor 102. In various embodiments, the exact material compositions of the electrically conductive material 118 may be different when used for different electrodes of the III-N transistor 102, or when used for different electrodes of different transistors within the IC structure 100.

Each of FIGS. 1A-1E further illustrates a gate stack 144 provided over the channel portion of the III-N channel material 112. The gate stack 144 may include a layer of a gate dielectric material 120, and a gate electrode material 122.

The gate dielectric material 120 may be a high-k dielectric material, e.g., a material including elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric material 120 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric material 120 during manufacture of the III-N transistor 102 to improve the quality of the gate dielectric material 120. A thickness of the gate dielectric material 120 may be between 0.5 nanometers and 10 nanometers, including all values and ranges therein, e.g., between 1 and 3 nanometers, or between 1 and 2 nanometers.

The gate electrode material 122 may include at least one P-type work function metal or N-type work function metal, depending on whether the III-N transistor 102 is a P-type metal-oxide-semiconductor (PMOS) transistor or an N-type metal-oxide-semiconductor (NMOS) transistor (e.g., P-type work function metal may be used as the gate electrode material 122 when the III-N transistors 102 is a PMOS transistor and N-type work function metal may be used as the gate electrode material 122 when the III-N transistor 102 is an NMOS transistor, depending on the desired threshold voltage). For a PMOS transistor, metals that may be used for the gate electrode material 122 may include, but are not limited to, ruthenium, palladium, platinum, cobalt, nickel, titanium nitride, and conductive metal oxides (e.g., ruthenium oxide). For an NMOS transistor, metals that may be used for the gate electrode material 122 include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and nitrides of these metals (e.g., tantalum nitride, and tantalum aluminum nitride). In some embodiments, the gate electrode material 122 may include a stack of two or more metal layers, where one or more metal layers are work function metal layers and at least one metal layer is a fill metal layer.

Further layers may be included next to the gate electrode material 122 for other purposes, such as to act as a diffusion barrier layer or/and an adhesion layer, not specifically shown in FIGS. 1A-1E. Furthermore, in some embodiments, the gate dielectric material 120 and the gate electrode material 122 may be surrounded by a gate spacer, not shown in FIGS. 1A-1E, configured to provide separation between the gates of different transistors. Such a gate spacer may be made of a low-k dielectric material (i.e., a dielectric material that has a lower dielectric constant (k) than silicon dioxide, which has a dielectric constant of 3.9). Examples of low-k materials that may be used as the dielectric gate spacer may include, but are not limited to, fluorine-doped silicon dioxide, carbon-doped silicon dioxide, spin-on organic polymeric dielectrics such as polyimide, polynorbornenes, benzocyclobutene, and polytetrafluoroethylene (PTFE), or spin-on silicon-based polymeric dielectric such as hydrogen silsesquioxane (HSQ) and methylsilsesquioxane (MSQ)). Other examples of low-k materials that may be used as the dielectric gate spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1.

In some embodiments of each of FIGS. 1A-1E, the IC structure 100 may, optionally, include a buffer material 124 between the III-N channel material 112 and the support structure 108. In some embodiments, the buffer material 124 may be a layer of a semiconductor material that has a band gap larger than that of the III-N channel material 112, so that the buffer material 124 can serve to prevent current leakage from the future III-N transistor to the support structure 108. Furthermore, a properly selected semiconductor for the buffer material 124 may enable better epitaxy of the III-N channel material 112 thereon, e.g., it may improve epitaxial growth of the III-N channel material 112, for instance in terms of a bridge lattice constant or amount of defects. For example, a semiconductor that includes aluminum, gallium, and nitrogen (e.g., AlGaN) or a semiconductor that includes aluminum and nitrogen (e.g., AlN) may be used as the buffer material 124 when the III-N channel material 112 is a semiconductor that includes gallium and nitrogen (e.g., GaN). Other examples of materials for the buffer material 124 may include materials typically used as ILD, described above, such as oxide isolation layers, e.g., silicon oxide, silicon nitride, aluminum oxide, and/or silicon oxynitride. When implemented in the III-N transistor 102, the buffer material 124 may have a thickness between about 100 and 5000 nanometers, including all values and ranges therein, e.g., between about 200 and 1000 nanometers, or between about 250 and 500 nanometers.

Turning to the details of the use of local stressors in the III-N transistor 102, FIG. 1A illustrates an embodiment where the compressive stressor material 150 is used on both sides of the gate stack 144 (i.e., on the source side and on the drain side). In various embodiments, the compressive stressor material 150 may include any material that imposes a compressive stress of at least about 2-3 GPa (in absolute values, since the compressive stress is negative) on the portion of the polarization material 114 below the compressive stressor material 150, reducing the tensile strain of the polarization material 114 and, thereby, decreasing the 2DEG formed in the portion of the III-N channel material 112 adjacent to (e.g., in contact with) the portion of the polarization material 114 with such decreased tensile strain.

In some embodiments, the compressive stressor material 150 may be a dielectric material. In such embodiments, the thickness of the compressive stressor material 150 may be between about 20 and 200 nanometers, including all values and ranges therein, e.g., between 25 and 150 nanometers, or between about 30 and 100 nanometers.

In some embodiments, the compressive stressor material 150 may be a semiconductor material.

In some embodiments, the compressive stressor material 150 may be a crystalline material. In such embodiments, the thickness of the compressive stressor material 150 may be between about 1 and 20 nanometers, including all values and ranges therein, e.g., between 1 and 15 nanometers, or between about 1 and 10 nanometers. In general, a crystalline material may serve as a compressive stressor material for a given polarization material 114, if a lattice constant of the crystalline compressive stressor material is larger than a lattice constant of the polarization material 114. For example, in some embodiments, the lattice constant of the crystalline compressive stressor material 150 may be at least about 3% larger, e.g., at least about 5% larger or at least about 10% larger, or anywhere between about 5 and 80% larger than the lattice constant of the polarization material 114. The crystalline compressive stressor material 150 having a lattice constant larger than that of the polarization material 114 would result in a compressive stress imposed on the portion of the polarization material 114 that is adjacent (e.g., in contact with) such crystalline compressive stressor material 150, which would counteract (i.e., diminish) the tensile stress imposed by the polarization material 114 on the adjacent portion of the III-N channel material 112 and reduce 2DEG formed therein.

In some embodiments of the compressive stressor material 150 being a dielectric material, the material 150 may be a material including silicon and nitrogen (e.g., SiN) with a stoichiometric relation of nitrogen to silicon being 80 to 20 (e.g., a nitrogen-rich SiN). Such stoichiometry would lead to the compressive stress of being at least 2 GPa, in absolute values, in contrast to, e.g., SiN used as a hard-mask material where the stoichiometric relation of nitrogen to silicon is about 50/50 and the hard-mask imposes a much smaller compressive stress, if any, on the polarization material 114 below. In other such embodiments, the material 150 may be a material including silicon, oxygen, and nitrogen (e.g., SiON) with a stoichiometric relation of oxygen to a combination of silicon and nitrogen being 60 to 40 (e.g., an oxygen-rich SiON, e.g., $SiO_{0.6}N_{0.4}$). In still other such embodiments, the material 150 may be a material including silicon, oxygen, and hydrogen (e.g., SiOH) with a stoichiometric relation of hydrogen to a combination of silicon and oxygen being 30 to 70 (e.g., a hydrogen-rich SiOH, e.g., $SiO_{0.3}H_{0.7}$).

In some embodiments of the compressive stressor material 150 being a crystalline material, the material 150 may be a material including boron and nitrogen in a hexagonal crystal structure (e.g., hexagonal boron nitride (BN)). In some embodiments, the compressive stressor material 150 may include one or more metal nitrides, which may be crystalline.

In some embodiments, material composition and thickness of the compressive stressor material 150 provided on the source side of the III-N transistor 102 of FIG. 1A may be the same as material composition and thickness of the compressive stressor material 150 provided on the drain side of the III-N transistor 102. In other embodiments, material compositions and/or thicknesses of the compressive stressor materials 150 provided on the source and drain sides may be different.

In contrast to the IC structure 100A shown in FIG. 1A, the IC structure 100B of FIG. 1B illustrates an embodiment where the tensile stressor material 152 is used on both sides of the gate stack 144 (i.e., on the source side and on the drain side). In various embodiments, the tensile stressor material 152 may include any material that imposes a tensile stress of at least about 2-3 GPa on the portion of the polarization material 114 below the tensile stressor material 152, increasing the tensile strain of the polarization material 114 and, thereby, increasing the 2DEG formed in the portion of the III-N channel material 112 adjacent to (e.g., in contact with) the portion of the polarization material 114 with such increased tensile strain.

In some embodiments, the tensile stressor material 152 may be a dielectric material. In such embodiments, the thickness of the tensile stressor material 152 may be between about 20 and 200 nanometers, including all values and ranges therein, e.g., between 25 and 150 nanometers, or between about 30 and 100 nanometers.

In some embodiments, the tensile stressor material 152 may be a semiconductor material.

In some embodiments, the tensile stressor material 152 may be a crystalline material. In such embodiments, the thickness of the tensile stressor material 152 may be between about 1 and 20 nanometers, including all values and ranges therein, e.g., between 1 and 15 nanometers, or between about 1 and 10 nanometers. In general, a crystalline material may serve as a tensile stressor material for a given polarization material 114, if a lattice constant of the crystalline tensile stressor material is smaller than a lattice constant of the polarization material 114. For example, in some embodiments, the lattice constant of the crystalline tensile stressor material 152 may be at least about 3% smaller, e.g., at least about 5% smaller or at least about 10% smaller, or anywhere between about 5 and 80% smaller than the lattice constant of the polarization material 114. The crystalline tensile stressor material 152 having a lattice constant smaller than that of the polarization material 114 would result in a tensile stress imposed on the portion of the polarization material 114 that is adjacent (e.g., in contact with) such crystalline tensile stressor material 152, which could enhance (i.e., increase) the tensile stress imposed by the polarization material 114 on the adjacent portion of the III-N channel material 112 and increase 2DEG formed therein.

In some embodiments of the tensile stressor material 152 being a dielectric material, the material 152 may be a material including silicon and nitrogen (e.g., SiN) with a stoichiometric relation of silicon to nitrogen being about 80 to 20 (e.g., a silicon-rich SiN). Such stoichiometry would lead to the tensile stress of being at least 2 GPa, in contrast to, e.g., SiN used as a hard-mask material. In further such embodiments, the material 152 may be a material including silicon, nitrogen, and hydrogen (e.g., SiN with added hydrogen) where hydrogen is between 10 and 40 percent. In other such embodiments, the material 152 may be a material including silicon, oxygen, and nitrogen (e.g., SiON) with a stoichiometric relation of a combination of silicon and nitrogen to oxygen being 60 to 40 (e.g., an oxygen-poor SiON, e.g., $SiO_{0.3}N_{0.7}$). In still other such embodiments, the material 152 may be a material including silicon, oxygen, and hydrogen (e.g., SiOH) with a stoichiometric relation of oxygen to a combination of silicon and hydrogen being 70 to 30 (e.g., a oxygen-rich SiOH, e.g., $SiO_{0.7}H_{0.3}$).

In some embodiments of the tensile stressor material 152 being a crystalline material, the material 152 may be a material including boron and nitrogen in a cubic crystal structure (e.g., cubic BN). In other embodiments of the tensile stressor material 152 being a crystalline material, the material 152 may be, or include, one or more of: a material including gallium and nitrogen (e.g., GaN), a material including indium, gallium, and nitrogen (e.g., InGaN), a material including gallium and arsenic (e.g., GaAs), and/or a material including indium, gallium, and arsenic (e.g., InGaAs). In some embodiments, the tensile stressor material 152 may include amorphous silicon. In other embodiments, the tensile stressor material 152 may include crystalline silicon, such as polycrystalline silicon (polysilicon), silicon, or silicon carbide (e.g., with a stoichiometric relation of silicon to carbon being about 30 to 70).

In some embodiments, material composition and thickness of the tensile stressor material 152 provided on the source side of the III-N transistor 102 of FIG. 1B may be the same as material composition and thickness of the tensile stressor material 152 provided on the drain side of the III-N transistor 102. In other embodiments, material compositions and/or thicknesses of the tensile stressor material 152 provided on the source and drain sides may be different.

While both FIG. 1A and FIG. 1B illustrate embodiments where the same type of stressor material is used on source and drain sides, in other embodiments, different stressor films can be used on the source and drain sides, e.g., to enhance or reduce the 2DEG charge to enable reduced on-resistance of a transistor (i.e., the total resistance between the drain and source) and, simultaneously, increase the breakdown voltage. The breakdown voltage, commonly abbreviated as BVDS, refers to the drain-source voltage, VDS, which causes a transistor to enter the breakdown region, which is the region where the transistor receives too much voltage across its drain-source terminal, which causes the drain-source terminal to break down, which makes the drain current, ID, drastically increase. The IC structure 100C of FIG. 1C illustrates an embodiment where the compressive stressor material 150 is used on one side of the gate stack 144, while the tensile stressor material 152 is used on the other side of the gate stack 144. For example, the compressive stressor material 150 may be used on the source side, while the tensile stressor material 152 may be used on the drain side, or vice versa. In various embodiments, the stressor materials 150, 152 of the IC structure 100C may be any of the stressor materials described above.

Still in other embodiments, a stressor material may be provided only on one side of the gate stack of a III-N transistor, but not on the other side. Examples of such embodiments are shown in FIGS. 1D and 1E. In particular, the IC structure 100D of FIG. 1D illustrates an embodiment where the compressive stressor material 150 is used on one side of the gate stack 144, which could be either source or drain side, and no stressor material is used on the other side. Such an embodiment may be particularly beneficial for reducing sheet resistance on the gate-source side, and/or for reducing charge on the gate-drain side, e.g., to enhance breakdown voltage. On the other hand, the IC structure 100E of FIG. 1E illustrates an embodiment where the tensile stressor material 152 is used on one side of the gate stack 144, which could be either source or drain side, and no stressor material is used on the other side. It should be noted that, as used herein, description that "no stressor material is used" on a certain side of a gate stack does not preclude use of some materials which may induce a certain stress in the underlying polarization material, e.g., a conventional hard-mask material, and only refers to the fact that a stressor material that induces stress of greater than about 2-3 GPa is not used.

In some embodiments, any of the IC structures 100A-100E may be included in, or used to implement at least a portion of an RF FE. In some embodiments, the III-N transistor 102 of any of the IC structures 100A-100E may be included in, or used to implement at least a portion of an RF circuit or a part of a power circuit. Although not specifically shown in FIGS. 1A-1E, the IC structure 100A may further include additional transistors similar to the III-N transistor 102, described above.

In some embodiments, local stressors as described herein may be used in III-N transistors coupled to one another. For example, FIG. 2 provides a cross-sectional side view illustrating an IC structure 200 that includes two coupled III-N transistors, 102-1 and 102-2, with local stressors, according to some embodiments of the present disclosure. In general, each of the III-N transistors 102-1 and 102-2 of the IC structure 200 may be the III-N transistor 102 according to any of the embodiments described above, e.g., as shown in any of FIGS. 1A-1E, with the example of FIG. 2 illustrating that the first III-N transistor 102-1 is the III-N transistor 102 as shown in FIG. 1A (i.e., with the compressive stressor material 150 used on both source and drain sides) and the second III-N transistor 102-2 is the III-N transistor 102 as shown in FIG. 1B (i.e., with the tensile stressor material 152 used on both source and drain sides). FIG. 2 illustrates that, in some embodiments, one of the S/D terminals of one III-N transistor with one or more local stressors may be coupled to one of the S/D terminals of another III-N transistor with one or more local stressors, e.g., to realize a cascade topology that may be used in a power amplifier or in an RF switch (e.g., a switch between different antenna elements) of a high-frequency device.

In other embodiments of the IC structure 200, any one or more of the terminals of the first III-N transistor 102-1 may be coupled to any one or more of the terminals of the second III-N transistor 102-2, all of which being within the scope of the present disclosure. For example, in some embodiments of a modified IC structure 200, the first and second III-N transistors 102-1 and 102-2 may have their gate electrodes coupled or shared (not shown in the present figures), which may be used in any circuits that use cascaded transistors, such as gate protection circuits, which may, e.g., also be used in control logic for any one or more of the elements of an RF device, e.g., the RF device 2500 shown in FIG. 9.

The IC structures 100/200 illustrated in FIGS. 1-2, with possible further modifications to such structures, e.g., as described above, do not represent an exhaustive set of assemblies in which at least one III-N transistor 102 may be provided with one or more local stressors 150 and/or 152, as described herein, but merely provide examples of such structures/assemblies. Some further examples of modifications of the IC structures 100/200 illustrated in FIGS. 1-2, all of which are within the scope of the present disclosure, are described below.

In one example, in further embodiments of the IC structures as shown in FIGS. 1-2, local stressor materials deposited at different portions of the IC structures may have different thicknesses (e.g., because some stressor materials may be crystalline materials, and, therefore, able to produce the desired stress with even relatively thin films, while other stressor materials may be non-crystalline materials which may need to be thicker to produce the desired stress). In another example, although particular arrangements of materials are discussed with reference to FIGS. 1-2, intermediate materials may be included in various portions of these figures, e.g. a hard-mask material (e.g., silicon nitride, which is an amorphous material that may serve as a hard-mask material) may be deposited over the polarization material and/or over local stressor materials described herein.

In another example, although not specifically shown in FIGS. 1-2, threshold voltage control implemented by the use of one or more local stressors as described herein may be complemented by (e.g., may be used in combination with) the use of polarization material recess. Thus, in any of the embodiments of the IC structures of FIGS. 1-2, the gate stack 144 may be provided in a recess in the polarization material 114 so that the thickness of the polarization material 114 between the gate stack and the III-N channel material 112 may be different from the thickness of the polarization material between the III-N channel material 112 and any of the local stressors 150, 152. In the embodiments where the gate stack 144 is provided in a recess in the polarization material 114, a thickness of the polarization material 114 between the gate stack 144 and the III-N material 112 may be between about 1 and 25 nanometers, including all values and ranges therein, e.g., between about 1 and 15 nanometers, between about 1 and 4 nanometers, between about 2 and 5 nanometers, between about 8 and 12 nanometers, or between about 12 and 13 nanometers.

Still in another example, although not specifically shown in FIGS. 1-2, in other embodiments, the IC structures 100/200 may include materials and structures which are flipped upside down with respect to the support structure 108. Namely, the stressor materials 150 and/or 152 may be provided over the substrate, then the polarization material 114 may be provided over the stressor materials 150 and/or 152, and the III-N channel material 112 may be provided over the polarization material 114. Thus, in general, in various embodiments of the present disclosure, in a III-N transistor, at least a portion of the polarization material 114 is between a portion of the III-N channel material 112 and one or more of the stressor materials 150 and/or 152, but whether it is the top-gated transistor as shown in FIGS. 1-2 (i.e., with the polarization material 114 being further away from the support structure 108 than the III-N channel material 112) or the bottom-gated transistor not specifically shown in FIGS. 1-2 (i.e., with the polarization material 114 being closer to the support structure 108 than the III-N channel material 112) may vary in different embodiments.

FIGS. 1-2 are intended to show relative arrangements of some of the components therein, and that various device components of these figures may include other components that are not specifically illustrated, e.g., various interfacial layers or various additional layers or elements. For example, although not specifically shown, the IC structures 100, 200 may include a solder resist material (e.g., polyimide or similar material) and one or more bond pads formed on upper-most interconnect layer of the IC structure, e.g., at the top of the IC structures 100/200 shown in FIGS. 1-2. The bond pads may be electrically coupled with a further interconnect structure and configured to route the electrical signals between the III-N transistor 102 and other external devices, and/or between the different III-N transistors 102. For example, solder bonds may be formed on the one or more bond pads to mechanically and/or electrically couple a chip including the IC structure 100/200 with another component (e.g., a circuit board). The IC structure 100/200 may have other alternative configurations to route the electrical signals from the interconnect layers, e.g., the bond pads described above may be replaced by or may further include other analogous features (e.g., posts) that route the electrical signals to external components.

Additionally, although some elements of the IC structures are illustrated in FIGS. 1-2 as being planar rectangles or formed of rectangular solids, this is simply for ease of illustration, and embodiments of various ones of these elements may be curved, rounded, or otherwise irregularly shaped as dictated by, and sometimes inevitable due to, the manufacturing processes used to fabricate semiconductor device assemblies. For example, while FIGS. 1-2 may illustrate various elements, e.g., the S/D regions 116, the S/D electrodes 142, etc., as having perfectly straight sidewall profiles (i.e., profiles where the sidewalls extend perpendicularly to the support structure 108), these idealistic profiles may not always be achievable in real-world manufacturing processes. Namely, while designed to have straight sidewall profiles, real-world openings which may be formed as a part of fabricating various elements of the IC structures shown in FIGS. 1-2 may end up having either so-called "re-entrant" profiles, where the width at the top of the opening is smaller than the width at the bottom of the opening, or "non-re-entrant" profile, where the width at the top of the opening is larger than the width at the bottom of the opening. Oftentimes, as a result of a real-world opening not having perfectly straight sidewalls, imperfections may form within the materials filling the opening. For example, typical for re-entrant profiles, a void may be formed in the center of the opening, where the growth of a given material filling the opening pinches off at the top of the opening. Therefore, present descriptions of various embodiments of integrating one or more local stressors with III-N transistors are equally applicable to embodiments where various elements of such integrated structures look different from those shown in the figures due to manufacturing processes used to form them.

Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of the integration of one or more local stressors deposited over polarization materials of one or more III-N transistors as described herein.

Manufacturing IC Structures Having III-N Transistors with Local Stressors

Figure 3:
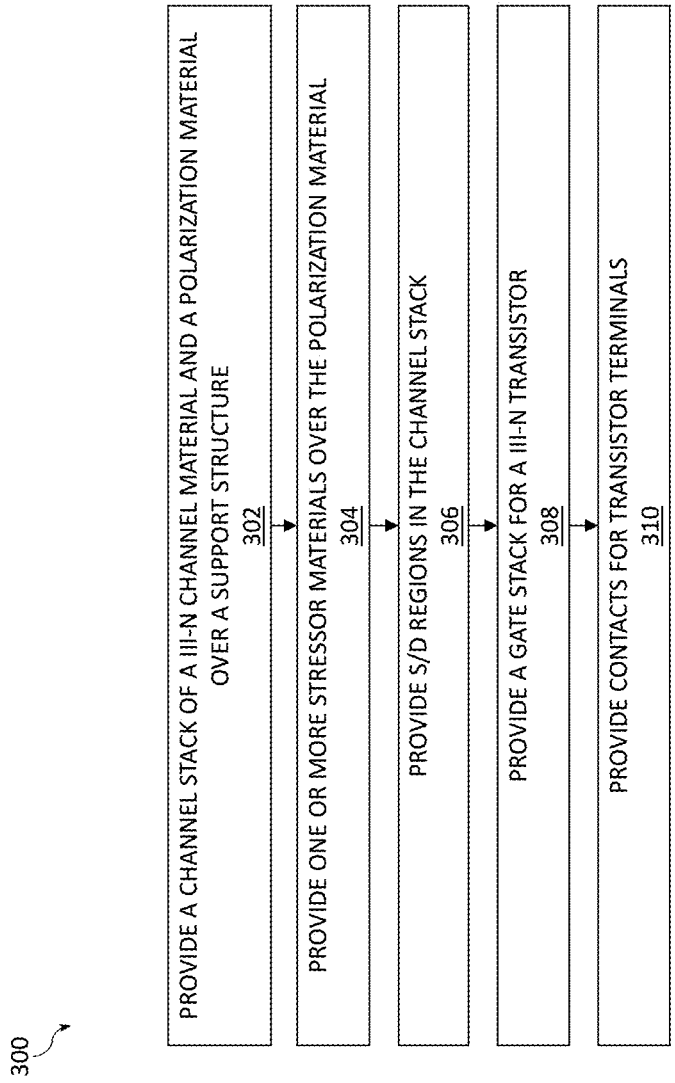
FIG. 3 is a flow diagram of an example method of manufacturing an IC structure that includes a III-N transistor with one or more local stressors, in accordance with various embodiments of the present disclosure.

The IC structures implementing at least one III-N transistor with one or more local stressors as described herein may be manufactured using any suitable techniques. FIG. 3 illustrates an example of such a method. However, other examples of manufacturing any of the IC structures described herein, as well as larger devices and assemblies that include such structures (e.g., as shown in FIGS. 6-9) are also within the scope of the present disclosure.

FIG. 3 is a flow diagram of an example method 300 of manufacturing an IC structure that includes a III-N transistor with one or more local stressors, in accordance with some embodiments of the present disclosure.

Although the operations of the method 300 are illustrated once each and in a particular order, the operations may be performed in any suitable order and repeated as desired. For example, one or more operations may be performed in parallel to manufacture, substantially simultaneously, multiple III-N transistors with one or more local stressors as described herein. In another example, the operations may be performed in a different order to reflect the structure of a particular device assembly in which one or more III-N transistors integrated with one or more local stressors as described herein will be included.

In addition, the example manufacturing method 300 may include other operations not specifically shown in FIG. 3, such as various cleaning or planarization operations as known in the art. For example, in some embodiments, the support structure 108, as well as layers of various other materials subsequently deposited thereon, may be cleaned prior to, after, or during any of the processes of the method 300 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the structures/assemblies described herein may be planarized prior to, after, or during any of the processes of the method 300 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Various operations of the method 300 may be illustrated with reference to the example embodiments shown in FIGS. 4A-4D, illustrating fabrication of an IC structure as shown in FIG. 1A, but the method 300 may be used to manufacture any suitable IC structures having one or more III-N transistors integrated with one or more local stressors according to any other embodiments of the present disclosure. FIGS. 4A-4D illustrate cross-sectional side views similar to the views shown in FIG. 1C, in various example stages in the manufacture of an IC structure using the method of FIG. 3 in accordance with some embodiments of the present disclosure.

Figure 4B:
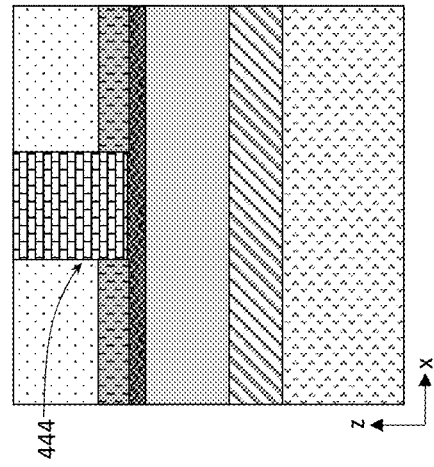
Figure 4A:
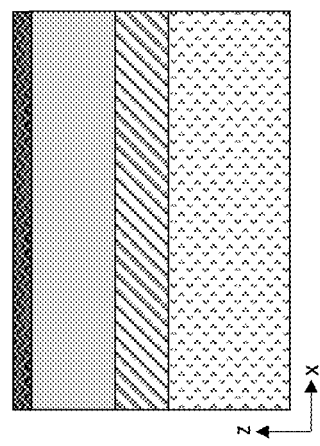

The method 300 may begin with providing a channel stack for the future III-N transistor, the channel stack including a layer of a III-N channel material over a support structure and a layer of a polarization material over the III-N channel material (process 302 shown in FIG. 3, a result of which is illustrated with an IC structure 402 shown in FIG. 4A). The IC structure 402 illustrates that the support structure provided in 302 may be the support structure 108 as described above. The IC structure 402 further illustrates that, first, optionally, the buffer material 124 may be provided over the support structure 108, and then the III-N channel material 112 may be provided over the buffer material 124, and then the polarization material 114 may be provided over the III-N channel material 112, as also shown in FIG. 4A.

In some embodiments, the process 302 may include epitaxially growing various transistor films, e.g., for forming the buffer material 124, the III-N channel material 112, and the polarization material 114. In this context, "epitaxial growth" refers to the deposition of crystalline overlayers in the form of the desired materials. The epitaxial growth of various layers of the process 302 may be carried out using any known gaseous or liquid precursors for forming the desired material layers.

The method 300 may then include providing one or more local stressor materials over the polarization material provided in the process 302 (process 304 shown in FIG. 3, a result of which is illustrated with an IC structure 404 shown in FIG. 4B). The IC structure 404 illustrates that the process 304 may include providing the compressive stressor material 150 on both side of a sacrificial structure which may be referred to as a dummy gate 444 because it may serve as a place-holder for the future gate stack of the III-N transistor. In some embodiments, the one or more local stressor materials may be epitaxially grown over the polarization material 114. In other embodiments, the one or more local stressor materials may be provided by other means, such as spin-coating, dip-coating, atomic layer deposition (ALD), physical vapor deposition (PVD) (e.g., evaporative deposition, magnetron sputtering, or e-beam deposition), or chemical vapor deposition (CVD).

In some embodiments, any of the processes 302 and 304 may include patterning to shape the channel stack and/or the local stressor materials in the desired geometry. For example, the channel stack may be shaped as an island (e.g., so that the channel stack is surrounded by an insulator, e.g. the insulator 110), the local stressors deposited in the process 304 may include different stressor materials provided over different regions of the polarization material, etc. Any suitable deposition techniques may be used to deposit the insulator 110, such as, but not limited to, spin-coating, dip-coating, ALD, PVD, or CVD. Examples patterning techniques which may be used in any of the processes 302 and 304 may include, but are not limited to, photolithographic or electron-beam (e-beam) patterning, possibly in conjunction with a suitable etching technique, e.g., a dry etch, such as RF reactive ion etch (RIE) or inductively coupled plasma (ICP) RIE. In various embodiments, any of the etches performed in any of the processes 302 and 304 may include an anisotropic etch. Some anisotropic etches may use etchants that take the form of a chemically active ionized gas (e.g., plasma). Some etchants may have a bromine-based chemistry or a chlorine-based chemistry. In some embodiments, during any of the etches of any of the processes 302 and 304, the IC structure may be heated to elevated temperatures, e.g., to temperatures between about room temperature and 200 degrees Celsius, including all values and ranges therein, to promote that byproducts of the etch are made sufficiently volatile to be removed from the surface.

The method 300 may then proceed with providing S/D regions in the IC structure (process 306 shown in FIG. 3, a result of which is illustrated with an IC structure 406 shown in FIG. 4C). The IC structure 406 illustrates that the process 306 may include forming the S/D regions 116, e.g., using any of the techniques described above, possibly using any suitable patterning techniques, e.g., as described above, to achieve the desired geometry for the S/D regions.

Once the S/D regions have been formed, the method 300 may proceed with providing a gate stack for the III-N transistor being formed (process 308 shown in FIG. 3, a result of which is illustrated with an IC structure 408 shown in FIG. 4D). The IC structure 408 illustrates that the process 308 may include removing the dummy gate 444 and forming the gate stack 144 in its place. The process 308 may include any suitable techniques for depositing the gate dielectric of the gate stack (e.g., using a conformal deposition process such as ALD), and then depositing the gate electrode material over the gate dielectric.

The method 300 may also include providing S/D contacts to form electrical contacts with the S/D regions and the gate stack (process 310 shown in FIG. 3, a result of which is not illustrated in FIGS. 4A-4D because the result may be the IC structure as shown in FIG. 1A). Examples of deposition techniques that may be used to provide S/D contacts in the process 310 include, but are not limited to, ALD, PVD, CVD, or electroplating.

Example Structures and Devices with III-N Transistors Integrated with Local Stressors IC structures that include at least one III-N transistor with one or more local stressors as disclosed herein may be included in any suitable electronic device. FIGS. 5-9 illustrate various examples of devices and components that may include one or more III-N transistors integrated with one or more local stressors as disclosed herein.

Figure 5B:
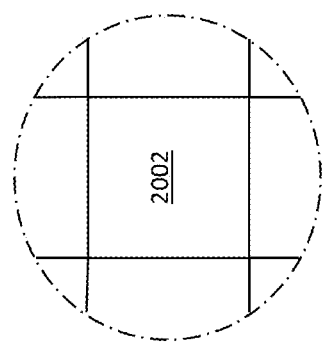
FIGS. 5A-5B are top views of a wafer and dies that include one or more IC structures having at least one III-N transistor with one or more local stressors in accordance with any of the embodiments of the present disclosure.
Figure 5A:
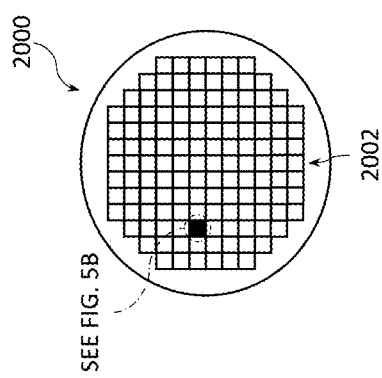

FIGS. 5A-5B are top views of a wafer 2000 and dies 2002 that may include at least one III-N transistor with one or more local stressors in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 6. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including at least one III-N transistor with one or more local stressors as described herein). After the fabrication of the semiconductor product is complete (e.g., after manufacture of at least one III-N transistor with one or more local stressors as described herein, e.g., after manufacture of any embodiment of the IC structures 100/200 described herein), the wafer 2000 may undergo a singulation process in which each of the dies 2002 is separated from one another to provide discrete "chips" of the semiconductor product. In particular, devices that include one or more III-N transistors integrated with local stressors as disclosed herein may take the form of the wafer 2000 (e.g., not singulated) or the form of the die 2002 (e.g., singulated). The die 2002 may include one or more III-N transistors (e.g., one or more III-N transistors 102 as described herein) as well as, optionally, supporting circuitry to route electrical signals to the III-N transistors, as well as any other IC components. In some embodiments, the wafer 2000 or the die 2002 may implement an RF FE device, a memory device (e.g., a static random-access memory (SRAM) device), a logic device (e.g., an AND, OR, NAND, or NOR gate), or any other suitable circuit element. Multiple ones of these devices may be combined on a single die 2002.

Figure 6:
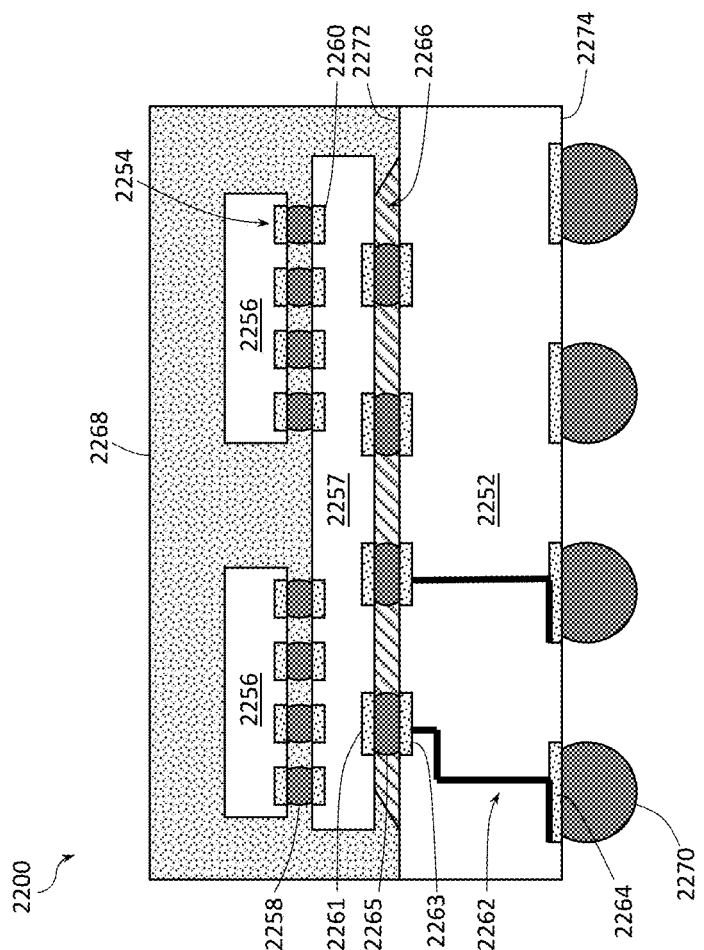
FIG. 6 is a cross-sectional side view of an IC package that may include one or more IC structures having at least one III-N transistor with one or more local stressors in accordance with any of the embodiments of the present disclosure.

FIG. 6 is a side, cross-sectional view of an example IC package 2200 that may include one or more IC structures having at least one III-N transistor with one or more local stressors in accordance with any of the embodiments disclosed herein. In some embodiments, the IC package 2200 may be a system-in-package (SiP).

As shown in FIG. 6, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 6 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 6 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 6 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 7.

The dies 2256 may take the form of any of the embodiments of the die 2002 discussed herein and may include any of the embodiments of an IC structure having at least one III-N transistor with one or more local stressors, e.g., any of the IC structures 100 or 200, described herein. In embodiments in which the IC package 2200 includes multiple dies 2256, the IC package 2200 may be referred to as a multi-chip-package (MCP). The dies 2256 may include circuitry to perform any desired functionality. For example, one or more of the dies 2256 may be RF FE dies, including one or more III-N transistors integrated with one or more local stressors in a single die as described herein, one or more of the dies 2256 may be logic dies (e.g., silicon-based dies), one or more of the dies 2256 may be memory dies (e.g., high bandwidth memory), etc. In some embodiments, any of the dies 2256 may include at least one III-N transistor with one or more local stressors, e.g., as discussed above; in some embodiments, at least some of the dies 2256 may not include any III-N transistors with local stressors.

The IC package 2200 illustrated in FIG. 6 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 6, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 7:
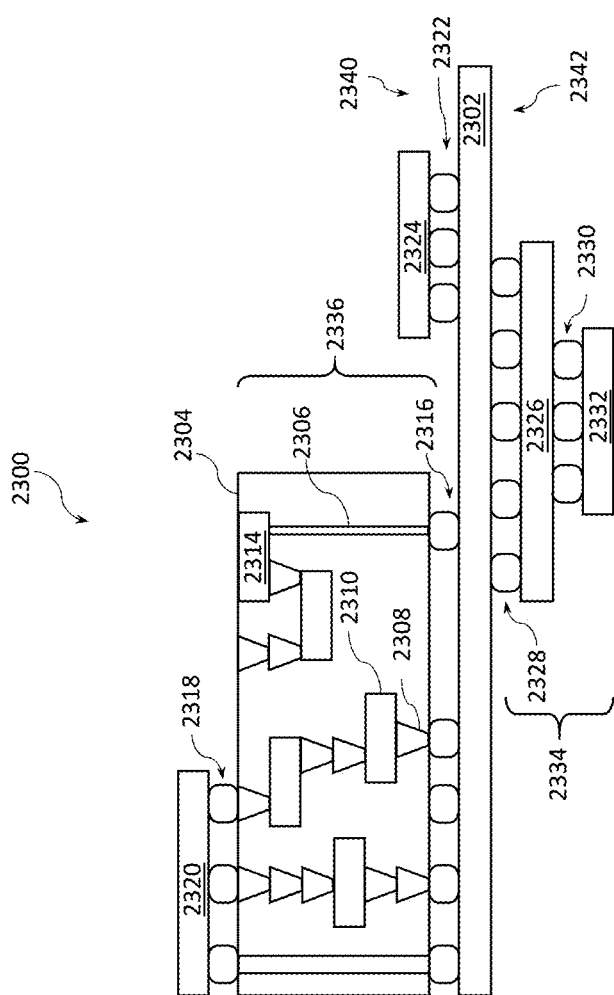
FIG. 7 is a cross-sectional side view of an IC device assembly that may include one or more IC structures having at least one III-N transistor with one or more local stressors in accordance with any of the embodiments of the present disclosure.

FIG. 7 is a cross-sectional side view of an IC device assembly 2300 that may include components having one or more IC structures implementing at least one III-N transistor with one or more local stressors in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC structures implementing at least one III-N transistor with one or more local stressors in accordance with any of the embodiments disclosed herein; e.g., any of the IC packages discussed below with reference to the IC device assembly 2300 may take the form of any of the embodiments of the IC package 2200 discussed above with reference to FIG. 6 (e.g., may include at least one III-N transistor with one or more local stressors in/on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 7 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 7), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 5B), an IC device (e.g., the IC structure of FIGS. 1-2), or any other suitable component. In particular, the IC package 2320 may include at least one III-N transistor with one or more local stressors as described herein. Although a single IC package 2320 is shown in FIG. 7, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 7, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC structures implementing at least one III-N transistor with one or more local stressors as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 7 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 8:
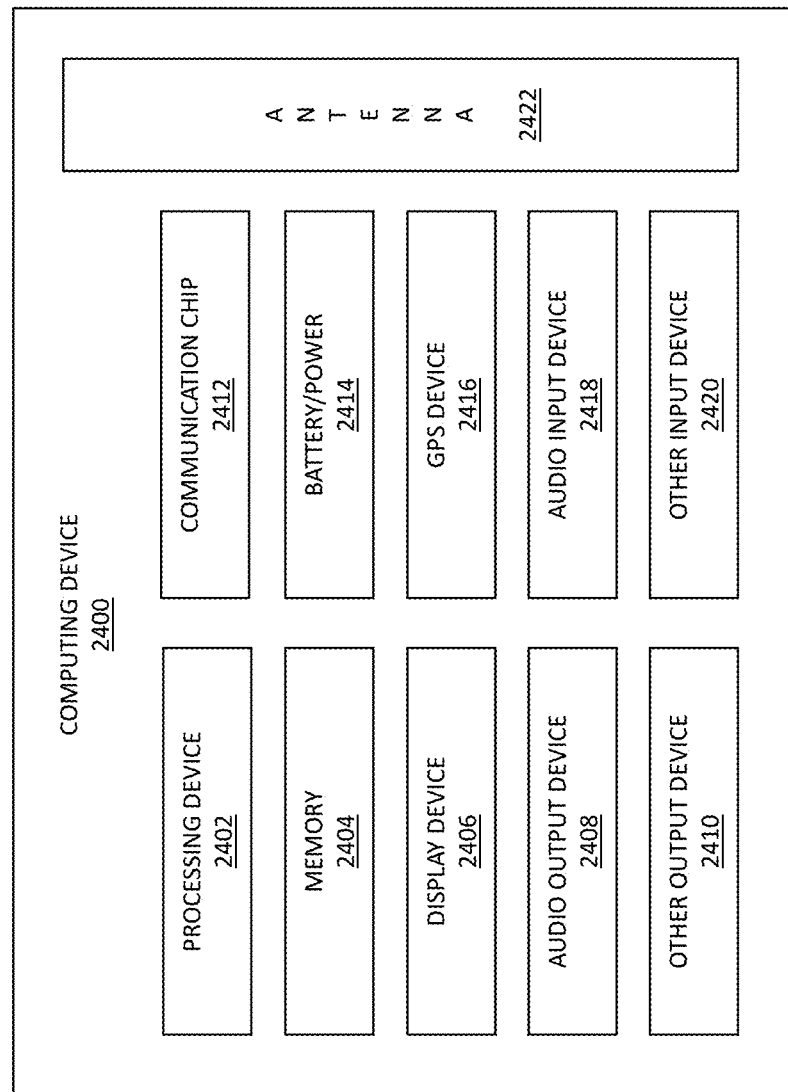
FIG. 8 is a block diagram of an example computing device that may include one or more IC structures having at least one III-N transistor with one or more local stressors in accordance with any of the embodiments of the present disclosure.

FIG. 8 is a block diagram of an example computing device 2400 that may include one or more components with one or more IC structures having at least one III-N transistor with one or more local stressors in accordance with any of the embodiments disclosed herein. For example, any suitable ones of the components of the computing device 2400 may include a die (e.g., the die 2002 (FIG. 5B)) including at least one III-N transistor with one or more local stressors in accordance with any of the embodiments disclosed herein. Any of the components of the computing device 2400 may include an IC device (e.g., any embodiment of the IC structure of FIGS. 1-2) and/or an IC package 2200 (FIG. 6). Any of the components of the computing device 2400 may include an IC device assembly 2300 (FIG. 7).

A number of components are illustrated in FIG. 8 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 8, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including WiFi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as WiFi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC structures as described herein may be particularly advantageous for use within the one or more communication chips 2412, described above. For example, such IC structures may be used to implement one or more of power amplifiers, low-noise amplifiers, filters (including arrays of filters and filter banks), switches, upconverters, downconverters, and duplexers, e.g., as a part of implementing an RF transmitter, an RF receiver, or an RF transceiver.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 9:
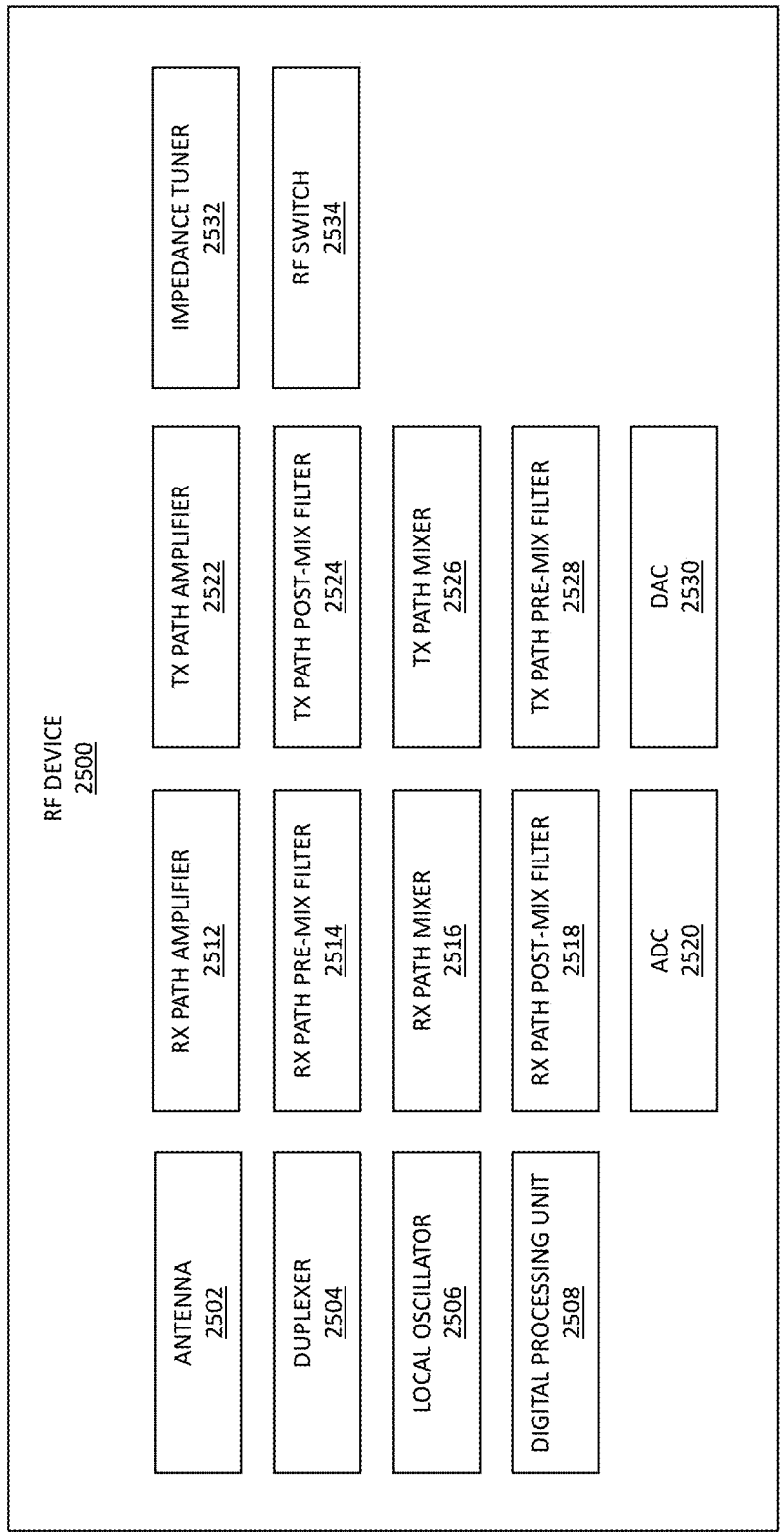
FIG. 9 is a block diagram of an example RF device that may include one or more IC structures having at least one III-N transistor with one or more local stressors in accordance with any of the embodiments of the present disclosure.

FIG. 9 is a block diagram of an example RF device 2500 that may include one or more components with one or more IC structures having at least one III-N transistor with one or more local stressors in accordance with any of the embodiments disclosed herein. For example, any suitable ones of the components of the RF device 2500 may include a die (e.g., the die 2002 as described with reference to FIG. 5 or a die implementing the IC structure as described with reference to FIG. 1 or 2) including one or more III-N transistors integrated with one or more local stressors in accordance with any of the embodiments disclosed herein. Any of the components of the RF device 2500 may include an IC device (e.g., the IC structure of FIGS. 1-2) and/or an IC package 2200 as described with reference to FIG. 6. Any of the components of the RF device 2500 may include an IC device assembly 2300 as described with reference to FIG. 7. In some embodiments, the RF device 2500 may be included within any components of the computing device 2400 as described with reference to FIG. 8, or may be coupled to any of the components of the computing device 2400, e.g., be coupled to the memory 2404 and/or to the processing device 2402 of the computing device 2400. In still other embodiments, the RF device 2500 may further include any of the components described with reference to FIG. 8, such as, but not limited to, the battery/power circuit 2414, the memory 2404, and various input and output devices as shown in FIG. 8.

In general, the RF device 2500 may be any device or system that may support wireless transmission and/or reception of signals in the form of electromagnetic waves in the RF range of approximately 3 kiloHertz (kHz) to 300 gigaHertz (GHz). In some embodiments, the RF device 2500 may be used for wireless communications, e.g., in a BS or a UE device of any suitable cellular wireless communications technology, such as GSM, WCDMA, or LTE. In a further example, the RF device 2500 may be used as, or in, e.g., a BS or a UE device of a mm-wave wireless technology such as fifth generation (5G) wireless (i.e., high frequency/short wavelength spectrum, e.g., with frequencies in the range between about 20 and 60 GHz, corresponding to wavelengths in the range between about 5 and 15 millimeters). In yet another example, the RF device 2500 may be used for wireless communications using WiFi technology (e.g., a frequency band of 2.4 GHz, corresponding to a wavelength of about 12 cm, or a frequency band of 5.8 GHz, spectrum, corresponding to a wavelength of about 5 cm), e.g., in a WiFi-enabled device such as a desktop, a laptop, a video game console, a smart phone, a tablet, a smart TV, a digital audio player, a car, a printer, etc. In some implementations, a WiFi-enabled device may, e.g., be a node in a smart system configured to communicate data with other nodes, e.g., a smart sensor. Still in another example, the RF device 2500 may be used for wireless communications using Bluetooth technology (e.g., a frequency band from about 2.4 to about 2.485 GHz, corresponding to a wavelength of about 12 cm). In other embodiments, the RF device 2500 may be used for transmitting and/or receiving RF signals for purposes other than communication, e.g., in an automotive radar system, or in medical applications such as magneto-resonance imaging (MRI).

In various embodiments, the RF device 2500 may be included in frequency-division duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

A number of components are illustrated in FIG. 9 as included in the RF device 2500, but any one or more of these components may be omitted or duplicated, as suitable for the application. For example, in some embodiments, the RF device 2500 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2500 may be an RF device supporting only wireless reception (e.g., an RF receiver), in which case it may include the components of the RX path, but not the components of the TX path; or the RF device 2500 may be an RF device supporting only wireless transmission (e.g., an RF transmitter), in which case it may include the components of the TX path, but not the components of the RX path.

In some embodiments, some or all of the components included in the RF device 2500 may be attached to one or more motherboards. In some embodiments, some or all of these components are fabricated on a single die, e.g., on a single SoC die.

Additionally, in various embodiments, the RF device 2500 may not include one or more of the components illustrated in FIG. 9, but the RF device 2500 may include interface circuitry for coupling to the one or more components. For example, the RF device 2500 may not include an antenna 2502, but may include antenna interface circuitry (e.g., a matching circuitry, a connector and driver circuitry) to which an antenna 2502 may be coupled. In another set of examples, the RF device 2500 may not include a digital processing unit 2508 or a local oscillator 2506, but may include device interface circuitry (e.g., connectors and supporting circuitry) to which a digital processing unit 2508 or a local oscillator 2506 may be coupled.

As shown in FIG. 9, the RF device 2500 may include an antenna 2502, a duplexer 2504, a local oscillator 2506, a digital processing unit 2508. As also shown in FIG. 9, the RF device 2500 may include an RX path which may include an RX path amplifier 2512, an RX path pre-mix filter 2514, a RX path mixer 2516, an RX path post-mix filter 2518, and an analog-to-digital converter (ADC) 2520. As further shown in FIG. 9, the RF device 2500 may include a TX path which may include a TX path amplifier 2522, a TX path post-mix filter 2524, a TX path mixer 2526, a TX path pre-mix filter 2528, and a digital-to-analog converter (DAC) 2530. Still further, the RF device 2500 may further include an impedance tuner 2532 and an RF switch 2534. In various embodiments, the RF device 2500 may include multiple instances of any of the components shown in FIG. 9. In some embodiments, the RX path amplifier 2512, the TX path amplifier 2522, the duplexer 2504, and the RF switch 2534 may be considered to form, or be a part of, an RF FE of the RF device 2500. In some embodiments, the RX path amplifier 2512, the TX path amplifier 2522, the duplexer 2504, and the RF switch 2534 may be considered to form, or be a part of, an RF FE of the RF device 2500. In some embodiments, the RX path mixer 2516 and the TX path mixer 2526 (possibly with their associated pre-mix and post-mix filters shown in FIG. 9) may be considered to form, or be a part of, an RF transceiver of the RF device 2500 (or of an RF receiver or an RF transmitter if only RX path or TX path components, respectively, are included in the RF device 2500). Although not specifically shown in FIG. 9, the RF device 2500 may further include one or more control logic elements/circuits for an RF device (e.g., in an RF FR control interface), e.g., to enhance control of complex RF system environment, support implementation of envelope tracking techniques, reduce dissipated power, etc. Various IC structures as described herein may be particularly advantageous for realizing at least portions of such control logic elements/circuits.

The antenna 2502 may be configured to wirelessly transmit and/or receive RF signals in accordance with any wireless standards or protocols, e.g., WiFi, LTE, or GSM, as well as any other wireless protocols that are designated as 3G, 4G, 5G, and beyond. If the RF device 2500 is an FDD transceiver, the antenna 2502 may be configured for concurrent reception and transmission of communication signals in separate (i.e., non-overlapping and non-continuous) bands of frequencies, e.g. in bands having a separation of, e.g., 20 MHz from one another. If the RF device 2500 is a TDD transceiver, the antenna 2502 may be configured for sequential reception and transmission of communication signals in bands of frequencies which may be the same, or overlapping for TX and RX paths. In some embodiments, the RF device 2500 may be a multi-band RF device, in which case the antenna 2502 may be configured for concurrent reception of signals having multiple RF components in separate frequency bands and/or configured for concurrent transmission of signals having multiple RF components in separate frequency bands. In such embodiments, the antenna 2502 may be a single wide-band antenna or a plurality of band-specific antennas (i.e., a plurality of antennas each configured to receive and/or transmit signals in a specific band of frequencies). In various embodiments, the antenna 2502 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2500 may include more than one antenna 2502 to implement antenna diversity. In some such embodiments, the RF switch 2534 may be deployed to switch between different antennas. Any of the embodiments of the IC structures with at least one III-N transistor with one or more local stressors may be used to implement the RF switch 2534.

An output of the antenna 2502 may be coupled to the input of the duplexer 2504. The duplexer 2504 may be any suitable component configured for filtering multiple signals to allow for bidirectional communication over a single path between the duplexer 2504 and the antenna 2502. The duplexer 2504 may be configured for providing RX signals to the RX path of the RF device 2500 and for receiving TX signals from the TX path of the RF device 2500.

The RF device 2500 may include one or more local oscillators 2506, configured to provide local oscillator signals which may be used for downconversion of the RF signals received by the antenna 2502 and/or upconversion of the signals to be transmitted by the antenna 2502.

The RF device 2500 may include the digital processing unit 2508, which may include one or more processing devices. In some embodiments, the digital processing unit 2508 may be implemented as the processing device 2402 shown in FIG. 8, descriptions of which are provided above (when used as the digital processing unit 2508, the processing device 2402 may, but does not have to, implement any of the IC structures as described herein, e.g., IC structures having one or more III-N transistors with one or more local stressors in accordance with any of the embodiments disclosed herein). The digital processing unit 2508 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 9, in some embodiments, the RF device 2500 may further include a memory device, e.g., the memory device 2404 as described with reference to FIG. 8, configured to cooperate with the digital processing unit 2508. When used within, or coupled to, the RF device 2500, the memory device 2404 may, but does not have to, implement any of the IC structures as described herein, e.g., IC structures having one or more III-N transistors with one or more local stressors in accordance with any of the embodiments disclosed herein.

Turning to the details of the RX path that may be included in the RF device 2500, the RX path amplifier 2512 may include a low noise amplifier (LNA). An input of the RX path amplifier 2512 may be coupled to an antenna port (not shown) of the antenna 2502, e.g., via the duplexer 2504. The RX path amplifier 2512 may amplify the RF signals received by the antenna 2502.

An output of the RX path amplifier 2512 may be coupled to an input of the RX path pre-mix filter 2514, which may be a harmonic or band-pass (e.g., low-pass) filter, configured to filter received RF signals that have been amplified by the RX path amplifier 2512.

An output of the RX path pre-mix filter 2514 may be coupled to an input of the RX path mixer 2516, also referred to as a downconverter. The RX path mixer 2516 may include two inputs and one output. A first input may be configured to receive the RX signals, which may be current signals, indicative of the signals received by the antenna 2502 (e.g., the first input may receive the output of the RX path pre-mix filter 2514). A second input may be configured to receive local oscillator signals from one of the local oscillators 2506. The RX path mixer 2516 may then mix the signals received at its two inputs to generate a downconverted RX signal, provided at an output of the RX path mixer 2516. As used herein, downconversion refers to a process of mixing a received RF signal with a local oscillator signal to generate a signal of a lower frequency. In particular, the mixer (downconverter) 2516 may be configured to generate the sum and/or the difference frequency at the output port when two input frequencies are provided at the two input ports. In some embodiments, the RF device 2500 may implement a direct-conversion receiver (DCR), also known as homodyne, synchrodyne, or zero-IF receiver, in which case the RX path mixer 2516 may be configured to demodulate the incoming radio signals using local oscillator signals whose frequency is identical to, or very close to the carrier frequency of the radio signal. In other embodiments, the RF device 2500 may make use of downconversion to an intermediate frequency (IF). IFs may be used in superheterodyne radio receivers, in which a received RF signal is shifted to an IF, before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2516 may include several such stages of IF conversion.

Although a single RX path mixer 2516 is shown in the RX path of FIG. 9, in some embodiments, the RX path mixer 2516 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2502 and an in-phase component of the local oscillator signal provided by the local oscillator 2506. The second RX path mixer may be configured for performing downconversion to generate a quadrature (Q) downconverted RX signal by mixing the RX signal received by the antenna 2502 and a quadrature component of the local oscillator signal provided by the local oscillator 2506 (the quadrature component is a component that is offset in phase from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2516 may, optionally, be coupled to the RX path post-mix filter 2518, which may be low-pass filters. In case the RX path mixer 2516 is a quadrature mixer that implements the first and second mixers as described above, the in-phase and quadrature components provided at the outputs of the first and second mixers respectively may be coupled to respective individual first and second RX path post-mix filters included in the filter 2518.

The ADC 2520 may be configured to convert the mixed RX signals from the RX path mixer 2516 from analog to digital domain. The ADC 2520 may be a quadrature ADC that, similar to the RX path quadrature mixer 2516, may include two ADCs, configured to digitize the downconverted RX path signals separated in in-phase and quadrature components. The output of the ADC 2520 may be provided to the digital processing unit 2508, configured to perform various functions related to digital processing of the RX signals so that information encoded in the RX signals can be extracted.

Turning to the details of the TX path that may be included in the RF device 2500, the digital signal to later be transmitted (TX signal) by the antenna 2502 may be provided, from the digital processing unit 2508, to the DAC 2530. Similar to the ADC 2520, the DAC 2530 may include two DACs, configured to convert, respectively, digital I- and Q-path TX signal components to analog form.

Optionally, the output of the DAC 2530 may be coupled to the TX path pre-mix filter 2528, which may be a band-pass (e.g., low-pass) filter (or a pair of band-pass, e.g., low-pass, filters, in case of quadrature processing) configured to filter out, from the analog TX signals output by the DAC 2530, the signal components outside of the desired band. The digital TX signals may then be provided to the TX path mixer 2526, which may also be referred to as an upconverter. Similar to the RX path mixer 2516, the TX path mixer 2526 may include a pair of TX path mixers, for in-phase and quadrature component mixing. Similar to the first and second RX path mixers that may be included in the RX path, each of the TX path mixers of the TX path mixer 2526 may include two inputs and one output. A first input may receive the TX signal components, converted to the analog form by the respective DAC 2530, which are to be upconverted to generate RF signals to be transmitted. The first TX path mixer may generate an in-phase (I) upconverted signal by mixing the TX signal component converted to analog form by the DAC 2530 with the in-phase component of the TX path local oscillator signal provided from the local oscillator 2506 (in various embodiments, the local oscillator 2506 may include a plurality of different local oscillators, or be configured to provide different local oscillator frequencies for the mixer 2516 in the RX path and the mixer 2526 in the TX path). The second TX path mixer may generate a quadrature phase (Q) upconverted signal by mixing the TX signal component converted to analog form by the DAC 2530 with the quadrature component of the TX path local oscillator signal. The output of the second TX path mixer may be added to the output of the first TX path mixer to create a real RF signal. A second input of each of the TX path mixers may be coupled the local oscillator 2506.

Optionally, the RF device 2500 may include the TX path post-mix filter 2524, configured to filter the output of the TX path mixer 2526.

The TX path amplifier 2522 may be a PA, configured to amplify the upconverted RF signal before providing it to the antenna 2502 for transmission. Any of the embodiments of the IC structures with at least one III-N transistor with one or more local stressors may be used to implement the PA 2522.

In various embodiments, any of the RX path pre-mix filter 2514, the RX path post-mix filter 2518, the TX post-mix filter 2524, and the TX pre-mix filter 2528 may be implemented as RF filters. In some embodiments, each of such RF filters may include one or more, typically a plurality of, resonators (e.g., film bulk acoustic resonators (FBARs), Lamb wave resonators, and/or contour-wave resonators), arranged, e.g., in a ladder configuration. An individual resonator of an RF filter may include a layer of a piezoelectric material such as aluminum nitride (AlN), enclosed between a bottom electrode and a top electrode, with a cavity provided around a portion of each electrode in order to allow a portion of the piezoelectric material to vibrate during operation of the filter. In some embodiments, an RF filter may be implemented as a plurality of RF filters, or a filter bank. A filter bank may include a plurality of RF resonators which may be coupled to a switch, e. g., the RF switch 2534, configured to selectively switch any one of the plurality of RF resonators on and off (i.e., activate any one of the plurality of RF resonators), in order to achieve desired filtering characteristics of the filter bank (i.e., in order to program the filter bank). For example, such a filter bank may be used to switch between different RF frequency ranges when the RF device 2500 is, or is included in, a BS or in a UE device. In another example, such a filter bank may be programmable to suppress TX leakage on the different duplex distances.

The impedance tuner 2532 may include any suitable circuitry, configured to match the input and output impedances of the different RF circuitries to minimize signal losses in the RF device 2500. For example, the impedance tuner 2532 may include an antenna impedance tuner. Being able to tune the impedance of the antenna 2502 may be particularly advantageous because antenna's impedance is a function of the environment that the RF device 2500 is in, e.g. antenna's impedance changes depending on, e.g., if the antenna is held in a hand, placed on a car roof, etc.

As described above, the RF switch 2534 may be used to selectively switch between a plurality of instances of any one of the components shown in FIG. 9, in order to achieve desired behavior and characteristics of the RF device 2500. For example, in some embodiments, an RF switch may be used to switch between different antennas 2502. In other embodiments, an RF switch may be used to switch between a plurality of RF resonators (e.g., by selectively switching RF resonators on and off) of any of the filters included in the RF device 2500.

In various embodiments, one or more of the III-N transistors with one or more local stressors as described herein may be particularly advantageous when used in any of the duplexer 2504, RX path amplifier 2512, RX path pre-mix filter 2514, RX path post-mix filter 2518, TX path amplifier 2522, TX path pre-mix filter 2528, TX path post-mix filter 2524, impedance tuner 2532, and/or RF switch 2534.

The RF device 2500 provides a simplified version and, in further embodiments, other components not specifically shown in FIG. 9 may be included. For example, the RX path of the RF device 2500 may include a current-to-voltage amplifier between the RX path mixer 2516 and the ADC 2520, which may be configured to amplify and convert the downconverted signals to voltage signals. In another example, the RX path of the RF device 2500 may include a balun transformer for generating balanced signals. In yet another example, the RF device 2500 may further include a clock generator, which may, e.g., include a suitable phased-lock loop (PLL), configured to receive a reference clock signal and use it to generate a different clock signal which may then be used for timing the operation of the ADC 2520, the DAC 2530, and/or which may also be used by the local oscillator 2506 to generate the local oscillator signals to be used in the RX path or the TX path.

Select Examples

The following paragraphs provide various examples of the embodiments disclosed herein.

Example 1 provides an IC structure that includes a support structure (e.g., a substrate, a die, or a chip) and a III-N transistor that includes a III-N semiconductor material, a first material, and a second material. The III-N semiconductor material and the first material may be considered to form a channel stack of the III-N transistor. A lattice constant of the first material is smaller than a lattice constant of the III-N semiconductor material (e.g., at least 3% smaller, or at least 5% smaller, e.g., between about 5 and 10% smaller). Thus, the first material may serve as a polarization material that induces formation of 2DEG in a portion of the III-N semiconductor material under the first material. A portion of the first material is between the III-N semiconductor material and the second material. A lattice constant of the second material is different from the lattice constant of the second material by at least 5%, including all values and ranges therein, e.g., by at least 10%, or by at least 20%, and, in various embodiments, up to as much as 80%. Such a second material may impose on the first material a compressive stress or a tensile stress having an absolute value equal to or greater than about 2 GigaPascal (GPa), e.g., equal to or greater than about 2.5 GPa, or equal to or greater than about 3 GPa.

Example 2 provides the IC structure according to example 1, where the III-N transistor includes a gate stack provided adjacent to a portion of the first material, the III-N transistor includes first and second source/drain (S/D) regions in the III-N semiconductor material, the portion of the first material that is between the III-N semiconductor material and the second material is between the gate stack and the first S/D region, and the second material is a compressive stressor material that has the lattice constant that is larger than the lattice constant of the first material, which may impose the compressive stress on the portion of the first material between the gate stack and the first S/D region.

Example 3 provides the IC structure according to examples 1 or 2, where the second material includes boron and nitrogen in a hexagonal crystal structure (e.g., hexagonal BN).

Example 4 provides the IC structure according to examples 1 or 2, where the second material includes one or more metal nitrides.

Example 5 provides the IC structure according to any one of examples 2-4, where the portion of the first material that is between the III-N semiconductor material and the second material is a first portion of the first material, the III-N transistor further includes a third material, a second portion of the first material is between the III-N semiconductor material and the third material, and the third material is a compressive stressor material that has the lattice constant that is larger than the lattice constant of the first material, which may impose the compressive stress on the portion of the first material adjacent to the third material. In various embodiments, the third material of example 5 may be a material which is substantially the same as the second material according to any one of examples 3-4.

Example 6 provides the IC structure according to any one of examples 2-4, where the portion of the first material that is between the III-N semiconductor material and the second material is a first portion of the first material, the III-N transistor further includes a third material, a second portion of the first material is between the III-N semiconductor material and the third material, and the third material is a tensile stressor material that has the lattice constant that is smaller than the lattice constant of the first material, which may impose the tensile stress on the second portion of the first material adjacent to the third material.

Example 7 provides the IC structure according to example 6, where the third material includes silicon. Examples of crystalline silicon materials include polycrystalline silicon (polysilicon), silicon, silicon carbide (e.g., with a stoichiometric relation of silicon to carbon being about 30 to 70), etc.

Example 8 provides the IC structure according to examples 6 or 7, where the third material includes one or more of a material including boron and nitrogen in a cubic crystal structure (e.g., cubic BN), a material including gallium and nitrogen (e.g., GaN), a material including indium, gallium, and nitrogen (e.g., InGaN), a material including gallium and arsenic (e.g., GaAs), and a material including indium, gallium, and arsenic (e.g., InGaAs).

Example 9 provides the IC structure according to example 1, where the III-N transistor includes a gate stack provided adjacent to a portion of the first material, the III-N transistor includes first and second source/drain (S/D) regions in the III-N semiconductor material, the portion of the first material that is between the III-N semiconductor material and the second material is between the gate stack and the first S/D region, and the second material is a tensile stressor material that has the lattice constant that is smaller than the lattice constant of the first material, which may impose the tensile stress on the portion of the first material between the gate stack and the first S/D region. In various embodiments, the second material of example 9 may be a material which is substantially the same as the third material according to any one of examples 6-8.

Example 10 provides the IC structure according to example 9, where the portion of the first material that is between the III-N semiconductor material and the second material is a first portion of the first material, the III-N transistor further includes a third material, a second portion of the first material is between the III-N semiconductor material and the third material, and the third material is a tensile stressor material that has the lattice constant that is smaller than the lattice constant of the first material, which may impose the tensile stress on the second portion of the first material adjacent to the third material. In various embodiments, the third material of example 10 may be a material which is substantially the same as the third material according to any one of examples 6-8.

Example 11 provides the IC structure according to any one of the preceding examples, where a thickness of the second material is between about 1 and 20 nanometers, including all values and ranges therein, e.g., between 1 and 15 nanometers, or between about 1 and 10 nanometers. In some embodiments, a thickness of the third material in any one of the preceding examples may also be between about 1 and 20 nanometers, including all values and ranges therein, e.g., between 1 and 15 nanometers, or between about 1 and 10 nanometers.

Example 12 provides an IC structure that includes a support structure (e.g., a substrate, a die, or a chip) and a III-N transistor that includes a III-N semiconductor material, a first material, and a second material. The III-N semiconductor material and the first material may be considered to form a channel stack of the III-N transistor. A lattice constant of the first material is smaller than a lattice constant of the III-N semiconductor material (e.g., at least 3% smaller, or at least 5% smaller, e.g., between about 5 and 10% smaller). Thus, the first material may serve as a polarization material that induces formation of 2DEG in a portion of the III-N semiconductor material under the first material. A portion of the first material is between the III-N semiconductor material and the second material. A compressive or a tensile stress imposed on the portion of the first material that is between the III-N semiconductor material and the second material (e.g., imposed on said portion of the first material by the second material adjacent to the first material) has an absolute value equal to or greater than about 2 GigaPascal (GPa), e.g., equal to or greater than about 2.5 GPa, or equal to or greater than about 3 GPa.

Example 13 provides the IC structure according to example 12, where the III-N transistor includes a gate stack provided adjacent to a portion of the first material, the III-N transistor includes first and second source/drain (S/D) regions in the III-N semiconductor material, the portion of the first material that is between the III-N semiconductor material and the second material is between the gate stack and the first S/D region, and the compressive or the tensile stress imposed on the portion of the first material is the compressive stress (e.g., the second material is a compressive stressor material that imposes the compressive stress on the portion of the polarization material between the gate stack and the first S/D region).

Example 14 provides the IC structure according to examples 12 or 13, where the second material includes a dielectric material including one or more of a material including silicon and nitrogen (e.g., SiN) with a stoichiometric relation of nitrogen to silicon being 80 to 20 (e.g., a nitrogen-rich SiN), a material including silicon, oxygen, and nitrogen (e.g., SiON) with a stoichiometric relation of oxygen to a combination of silicon and nitrogen being 60 to 40 (e.g., an oxygen-rich SiON), and a material including silicon, oxygen, and hydrogen (e.g., SiOH) with a stoichiometric relation of hydrogen to a combination of silicon and oxygen being 30 to 70 (e.g., a hydrogen-rich SiOH).

Example 15 provides the IC structure according to example 12, where the III-N transistor includes a gate stack provided adjacent to a portion of the first material, the III-N transistor includes first and second source/drain (S/D) regions in the III-N semiconductor material, the portion of the first material that is between the III-N semiconductor material and the second material is between the gate stack and the first S/D region, and the compressive or the tensile stress imposed on the portion of the first material is the tensile stress (e.g., the second material is a tensile stressor material that imposes the tensile stress on the portion of the polarization material between the gate stack and the first S/D region).

Example 16 provides the IC structure according to examples 12 or 15, where the second material includes a dielectric material including one or more of a material including silicon and nitrogen (e.g., SiN) with a stoichiometric relation of silicon to nitrogen being about 80 to 20 (e.g., a silicon-rich SiN), a material including silicon, nitrogen, and hydrogen (e.g., SiN with added hydrogen) where hydrogen is between 10 and 40 percent, a material including silicon, oxygen, and nitrogen (e.g., SiON) with a stoichiometric relation of a combination of silicon and nitrogen to oxygen being 60 to 40 (e.g., an oxygen-poor SiON), and a material including silicon, oxygen, and hydrogen (e.g., SiOH) with a stoichiometric relation of oxygen to a combination of silicon and hydrogen being 70 to 30 (e.g., a oxygen-rich SiOH).

Example 17 provides the IC structure according to examples 12 or 15, where the second material includes amorphous or crystalline silicon. Examples of crystalline silicon materials include polycrystalline silicon (polysilicon), silicon, silicon carbide (e.g., with a stoichiometric relation of silicon to carbon being about 30 to 70), etc.

Example 18 provides the IC structure according to any one of examples 12-17, where a thickness of the second material is between about 20 and 200 nanometers, including all values and ranges therein, e.g., between 25 and 150 nanometers, or between about 30 and 100 nanometers.

In further examples, the second material of the IC structure of example 12 may be a crystalline material, e.g., according to any one of examples 1-11. Furthermore, the IC structure according to any one of examples 12-18 may include the same or different types of stressor materials on either side of the gate stack of the III-N transistor.

In some examples, the IC structure according to any one of the preceding examples may be such that the III-N transistor is a first III-N transistor and the IC structure further includes a second III-N transistor. In some such examples, one of the S/D electrodes of the first III-N transistor may be coupled to one of S/D electrodes of the second III-N transistor, thus forming a cascode amplifier.

Example 19 provides the IC structure according to any one of the preceding examples, where the second material is in contact with the first material.

Example 20 provides the IC structure according to any one of the preceding examples, where the first material includes a material that imposes the tensile stress on the III-N semiconductor material (e.g., a semiconductor material having stronger piezo-polarization behavior/properties than the III-N semiconductor material), and where at least a portion of the first material may form a heterojunction with at least a portion of the III-N semiconductor material.

Example 21 provides the IC structure according to example 20, where the first material includes aluminum, indium, gallium, and nitrogen (e.g., $Al_xIn_yGa_zN$).

Example 22 provides the IC structure according to any one of the preceding examples, where the IC structure is included in one of a switch, a power amplifier, a low-noise amplifier, a filter, a filter bank, a duplexer, an upconverter, a downconverter, or a logic circuit of an RF communications device, e.g. of an RF transceiver.

Example 23 provides the IC structure according to any one of the preceding examples, where the III-N transistor is a part of a radio frequency (RF) circuit.

Example 24 provides the IC structure according to any one of the preceding examples, where the IC structure is included in, or used to implement at least a portion of, an RF FE.

Example 25 provides the IC structure according to any one of examples 1-22, where the III-N transistor is a part of a power circuit.

Example 26 provides an IC package that includes an IC die, the IC die including the IC structure according to any one of the preceding examples (e.g., any one of examples 1-25), and a further IC component, coupled to the IC die.

Example 27 provides the IC package according to example 26, where the further IC component includes one of a package substrate, an interposer, or a further IC die.

Example 28 provides the IC package according to examples 26 or 27, where the IC package is included in a base station of a wireless communication system.

Example 29 provides the IC package according to examples 26 or 27, where the IC package is included in a user equipment device (i.e., a mobile device) of a wireless communication system.

Example 30 provides the IC package according to any one of the preceding examples, where the IC die is a part of an RF device.

Example 31 provides an electronic device that includes a carrier substrate and an IC die coupled to the carrier substrate, where the IC die includes the IC structure according to any one of examples 1-25, and/or is included in the IC package according to any one of examples 26-30.

Example 32 provides the electronic device according to example 31, where the computing device is a wearable or handheld electronic device.

Example 33 provides the electronic device according to examples 31 or 32, where the electronic device further includes one or more communication chips and an antenna.

Example 34 provides the electronic device according to any one of examples 31-33, where the carrier substrate is a motherboard.

Example 35 provides the electronic device according to any one of examples 31-34, where the electronic device is an RF transceiver.

Example 36 provides the electronic device according to any one of examples 31-35, where the electronic device is one of a switch, a power amplifier, a low-noise amplifier, a filter, a filter bank, a duplexer, an upconverter, or a downconverter of an RF communications device, e.g. of an RF transceiver.

Example 37 provides the electronic device according to any one of examples 31-36, where the electronic device is included in a base station of a wireless communication system.

Example 38 provides the electronic device according to any one of examples 31-37, where the electronic device is included in a user equipment device (i.e., a mobile device) of a wireless communication system.

Example 39 provides a method of manufacturing an IC structure, the method including providing a III-N semiconductor material over a support structure (e.g., a substrate, a die, or a chip); providing a first material over the III-N semiconductor material; providing a second material over at least a portion of the first material, the second material imposing, on the first material, a compressive stress or a tensile stress having an absolute value equal to or greater than about 2 GigaPascal (GPa), e.g., equal to or greater than about 2.5 GPascal, or equal to or greater than about 3 GPascal; and forming a III-N transistor so that a portion of the III-N semiconductor material forms a channel region of the III-N transistor, and so that at least a portion of the second material is over the first material that is between a gate stack of the III-N transistor and at least one of source and drain (S/D) regions of the III-N transistor.

Example 40 provides the method according to example 39, further including forming a further III-N transistor so that a further portion of the III-N semiconductor material forms a channel region of the further III-N transistor.

Example 41 provides the method according to example 40, where one of the III-N transistor and the further III-N transistor is a depletion mode transistor and another one of the III-N transistor and the further III-N transistor is an enhancement mode transistor.

Example 42 provides the method according to any one of examples 39-41, where the IC structure is the IC structure according to any one of examples 1-25, and the method includes corresponding further processes to manufacture any of these IC structures.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:
1. An integrated circuit (IC) structure, comprising:
  a transistor that includes:
    a III-N semiconductor material,
    a first material, where a lattice constant of the first material is smaller than a lattice constant of the III-N semiconductor material,
    a gate adjacent to a portion of the first material,
    a first region and a second region, wherein one of the first region and the second region is a source region of the transistor and another one of the first region and the second region is a drain region of the transistor,
    a second material between the gate and the first region, and
    a third material between the gate and the second region,
  wherein:
    a first portion of the first material is between the III-N semiconductor material and the second material,
    a second portion of the first material is between the III-N semiconductor material and the third material, and the lattice constant of the first material is smaller than a lattice constant of the second material and larger than the lattice constant of the third material.

2. The IC structure according to claim 1, wherein the second material includes boron and nitrogen in a hexagonal crystal structure.

3. The IC structure according to claim 1, wherein the second material includes one or more metal nitrides.

4. The IC structure according to claim 1, wherein the third material includes silicon.

5. The IC structure according to claim 1, wherein the third material includes one or more of:
a material including boron and nitrogen in a cubic crystal structure,
a material including gallium and nitrogen,
a material including indium, gallium, and nitrogen,
a material including gallium and arsenic, and
a material including indium, gallium, and arsenic.

6. The IC structure according to claim 1, wherein a thickness of the second material is between 1 and 20 nanometers.

7. The IC structure according to claim 1, wherein a stress in the first portion of the first material has an absolute value equal to or greater than 2 Giga Pascal.

8. The IC structure according to claim 1, wherein a stress in the second portion of the first material has an absolute value equal to or greater than 2 GigaPascal.

9. The IC structure according to claim 1, wherein a thickness of the third material is between 1 and 20 nanometers.

10. The IC structure according to claim 1, wherein the second material includes boron and nitrogen.

11. The IC structure according to claim 1, wherein the second material includes nitrogen and a metal.

12. A method of manufacturing an integrated circuit (IC) structure, the method comprising:
providing a III-N semiconductor material over a support structure;
providing a first material over the III-N semiconductor material;
providing a second material over at least a portion of the first material, wherein a lattice constant of the second material is larger than a lattice constant of the first material;
providing a third material over a further portion of the first material, wherein a lattice constant of the third material is smaller than the lattice constant of the first material; and
forming a transistor, wherein a portion of the III-N semiconductor material is a channel region of the transistor, at least a portion of the second material is over a portion of the first material that is between a gate of the transistor and one of a source region and a drain region of the transistor, and at least a portion of the third material is over a portion of the first material that is between the gate of the transistor and another one of the source region and the drain region of the transistor.

13. The method according to claim 12, further comprising:
forming a further transistor so that a further portion of the III-N semiconductor material forms a channel region of the further transistor.

14. The method according to claim 13, wherein one of the transistor and the further transistor is a depletion mode transistor and another one of the transistor and the further transistor is an enhancement mode transistor.

15. An electronic device, comprising:
a carrier substrate; and
an integrated circuit (IC) die coupled to the carrier substrate, wherein the IC die includes a transistor, the transistor comprising:
a III-N semiconductor material,
a first material, where a lattice constant of the first material is smaller than a lattice constant of the III-N semiconductor material,
a gate adjacent to a portion of the first material,
a first region and a second region, wherein one of the first region and the second region is a source region of the transistor and another one of the first region and the second region is a drain region of the transistor,
a second material between the gate and the first region, and
a third material between the gate and the second region,
wherein:
a first portion of the first material is between the III-N semiconductor material and the second material,
a second portion of the first material is between the III-N semiconductor material and the third material, and
the lattice constant of the first material is smaller than a lattice constant of the second material and larger than the lattice constant of the third material.

16. The electronic device according to claim 15, wherein the electronic device is a wearable or handheld electronic device.

17. The electronic device according to claim 15, wherein the electronic device further includes one or more communication chips and an antenna.

18. The electronic device according to claim 15, wherein the carrier substrate is a motherboard.

19. The electronic device according to claim 15, wherein the electronic device is a radio frequency transceiver.

20. The electronic device according to claim 15, wherein the electronic device is one of a switch, a power amplifier, a low-noise amplifier, a filter, a filter bank, a duplexer, a frequency upconverter, or a frequency downconverter.

* * * * *

UNITED STATES PATENT AND TRADEMARK OFFICE
CERTIFICATE OF CORRECTION

PATENT NO. : 11,670,709 B2
APPLICATION NO. : 16/297837
DATED : June 6, 2023
INVENTOR(S) : Sansaptak Dasgupta et al.

It is certified that error appears in the above-identified patent and that said Letters Patent is hereby corrected as shown below:

In the Claims

In Column 39, Claim 7, Line 24, delete "Giga Pascal." and insert -- GigaPascal. --, therefor.

Signed and Sealed this
First Day of August, 2023

Katherine Kelly Vidal
*Director of the United States Patent and Trademark Office*